(12) United States Patent
Neudecker et al.

(10) Patent No.: US 8,197,781 B2
(45) Date of Patent: Jun. 12, 2012

(54) SPUTTERING TARGET OF $LI_3PO_4$ AND METHOD FOR PRODUCING SAME

(75) Inventors: Bernd J. Neudecker, Littleton, CO (US); Vassiliki Milonopoulou, San Jose, CA (US)

(73) Assignee: Infinite Power Solutions, Inc., Littleton, CO (US)

( * ) Notice: Subject to any disclaimer, the term of this patent is extended or adjusted under 35 U.S.C. 154(b) by 1254 days.

(21) Appl. No.: 11/935,000

(22) Filed: Nov. 5, 2007

(65) Prior Publication Data
US 2008/0173542 A1 Jul. 24, 2008

Related U.S. Application Data

(60) Provisional application No. 60/864,755, filed on Nov. 7, 2006.

(51) Int. Cl.
*C01B 15/16* (2006.01)
(52) U.S. Cl. ........ 423/312; 423/313; 428/633; 428/702; 117/941; 204/298.13
(58) Field of Classification Search .................. 423/312, 423/313; 428/702, 633; 117/941; 204/298.13
See application file for complete search history.

(56) References Cited

U.S. PATENT DOCUMENTS

| 712,316 A | 10/1902 | Loppe et al. |
| 2,970,180 A | 1/1961 | Urry |
| 3,309,302 A | 3/1967 | Heil |
| 3,616,403 A | 10/1971 | Collins et al. |
| 3,790,432 A | 2/1974 | Fletcher et al. |
| 3,797,091 A | 3/1974 | Gavin |
| 3,850,604 A | 11/1974 | Klein |
| 3,939,008 A | 2/1976 | Longo et al. |
| 4,082,569 A | 4/1978 | Evans, Jr. |
| 4,111,523 A | 9/1978 | Kaminow et al. |
| 4,127,424 A | 11/1978 | Ullery, Jr. |
| 4,226,924 A | 10/1980 | Kimura et al. |
| 4,283,216 A | 8/1981 | Brereton |
| 4,318,938 A | 3/1982 | Barnett et al. |
| 4,328,297 A | 5/1982 | Bilhorn |
| 4,437,966 A | 3/1984 | Hope et al. |
| 4,442,144 A | 4/1984 | Pipkin |
| 4,467,236 A | 8/1984 | Kolm et al. |
| 4,481,265 A | 11/1984 | Ezawa et al. |
| 4,518,661 A | 5/1985 | Rippere |
| 4,555,456 A | 11/1985 | Kanehori et al. |
| 4,572,873 A | 2/1986 | Kanehori et al. |
| 4,587,225 A | 5/1986 | Tsukuma et al. |
| 4,619,680 A | 10/1986 | Nourshargh et al. |
| 4,645,726 A | 2/1987 | Hiratani et al. |
| 4,664,993 A | 5/1987 | Sturgis et al. |
| 4,668,593 A | 5/1987 | Sammells |
| RE32,449 E | 6/1987 | Claussen |
| 4,672,586 A | 6/1987 | Shimohigashi et al. |
| 4,710,940 A | 12/1987 | Sipes, Jr. |
| 4,728,588 A | 3/1988 | Noding et al. |
| 4,740,431 A | 4/1988 | Little |
| 4,756,717 A | 7/1988 | Sturgis et al. |
| 4,785,459 A | 11/1988 | Baer |
| 4,826,743 A | 5/1989 | Nazri |
| 4,865,428 A | 9/1989 | Corrigan |
| 4,878,094 A | 10/1989 | Balkanski |
| 4,903,326 A | 2/1990 | Zakman et al. |
| 4,915,810 A | 4/1990 | Kestigian et al. |
| 4,964,877 A | 10/1990 | Keister et al. |
| 4,977,007 A | 12/1990 | Kondo et al. |
| 4,978,437 A | 12/1990 | Wirz |
| 5,006,737 A | 4/1991 | Fay |
| 5,019,467 A | 5/1991 | Fujiwara |
| 5,030,331 A | 7/1991 | Sato |
| 5,035,965 A | 7/1991 | Sangyoji et al. |
| 5,055,704 A | 10/1991 | Link et al. |
| 5,057,385 A | 10/1991 | Hope et al. |
| 5,085,904 A | 2/1992 | Deak et al. |
| 5,096,852 A | 3/1992 | Hobson |
| 5,100,821 A | 3/1992 | Fay |
| 5,107,538 A | 4/1992 | Benton et al. |
| 5,110,694 A | 5/1992 | Nagasubramanian et al. |
| 5,110,696 A | 5/1992 | Shokoohi et al. |
| 5,119,269 A | 6/1992 | Nakayama |
| 5,119,460 A | 6/1992 | Bruce et al. |
| 5,124,782 A | 6/1992 | Hundt et al. |
| 5,147,985 A | 9/1992 | DuBrucq |
| 5,153,710 A | 10/1992 | McCain |
| 5,169,408 A | 12/1992 | Biggerstaff et al. |
| 5,171,413 A | 12/1992 | Arntz et al. |
| 5,173,271 A | 12/1992 | Chen et al. |
| 5,174,876 A | 12/1992 | Buchal et al. |
| 5,180,645 A | 1/1993 | Moré |
| 5,187,564 A | 2/1993 | McCain |
| 5,196,041 A | 3/1993 | Tumminelli et al. |
| 5,196,374 A | 3/1993 | Hundt et al. |
| 5,200,029 A | 4/1993 | Bruce et al. |

(Continued)

FOREIGN PATENT DOCUMENTS
CN 1415124 4/2003
(Continued)

OTHER PUBLICATIONS

Bates et al., "Thin-Film Lithium Batteries" in New Trends in Electrochemical Technology: Energy Storage Systems for Electronics (T. Osaka & M. Datta eds. Gordon and Breach 2000).

(Continued)

*Primary Examiner* — Steven Bos
(74) *Attorney, Agent, or Firm* — Dewey & LeBoeuf LLP; Jeff E. Schwartz (57) ABSTRACT

A method of forming a lithium orthophosphate sputter target or tile and resulting target material is presented. The target is fabricated from a pure lithium orthophosphate powder refined to a fine powder grain size. After steps of consolidation into a ceramic body, packaging and degassing, the ceramic body is densified to high density, and transformed into a stable single phase of pure lithium orthophosphate under sealed atmosphere. The lithium orthophosphate target is comprised of a single phase, and can preferably have a phase purity greater than 95% and a density of greater than 95%.

23 Claims, 5 Drawing Sheets

U.S. PATENT DOCUMENTS

| | | |
|---|---|---|
| 5,202,201 A | 4/1993 | Meunier et al. |
| 5,206,925 A | 4/1993 | Nakazawa et al. |
| 5,208,121 A | 5/1993 | Yahnke et al. |
| 5,217,828 A | 6/1993 | Sangyoji et al. |
| 5,221,891 A | 6/1993 | Janda et al. |
| 5,225,288 A | 7/1993 | Beeson et al. |
| 5,227,264 A | 7/1993 | Duval et al. |
| 5,237,439 A | 8/1993 | Misono et al. |
| 5,252,194 A | 10/1993 | Demaray et al. |
| 5,262,254 A | 11/1993 | Koksbang et al. |
| 5,273,608 A | 12/1993 | Nath |
| 5,287,427 A | 2/1994 | Atkins et al. |
| 5,296,089 A | 3/1994 | Chen et al. |
| 5,300,461 A | 4/1994 | Ting |
| 5,303,319 A | 4/1994 | Ford et al. |
| 5,306,569 A | 4/1994 | Hiraki |
| 5,307,240 A | 4/1994 | McMahon |
| 5,309,302 A | 5/1994 | Vollmann |
| 5,314,765 A | 5/1994 | Bates |
| 5,326,652 A | 7/1994 | Lake |
| 5,326,653 A | 7/1994 | Chang |
| 5,338,624 A | 8/1994 | Gruenstern et al. |
| 5,338,625 A | 8/1994 | Bates et al. |
| 5,342,709 A | 8/1994 | Yahnke et al. |
| 5,355,089 A | 10/1994 | Treger |
| 5,360,686 A | 11/1994 | Peled et al. |
| 5,362,579 A | 11/1994 | Rossoll et al. |
| 5,381,262 A | 1/1995 | Arima et al. |
| 5,387,482 A | 2/1995 | Anani |
| 5,401,595 A | 3/1995 | Kagawa et al. |
| 5,403,680 A | 4/1995 | Otagawa et al. |
| 5,411,537 A | 5/1995 | Munshi et al. |
| 5,411,592 A | 5/1995 | Ovshinsky et al. |
| 5,419,982 A | 5/1995 | Tura et al. |
| 5,427,669 A | 6/1995 | Drummond |
| 5,435,826 A | 7/1995 | Sakakibara et al. |
| 5,437,692 A | 8/1995 | Dasgupta et al. |
| 5,445,856 A | 8/1995 | Chaloner-Gill |
| 5,445,906 A * | 8/1995 | Hobson et al. ................ 429/162 |
| 5,448,110 A | 9/1995 | Tuttle et al. |
| 5,449,576 A | 9/1995 | Anani |
| 5,455,126 A | 10/1995 | Bates et al. |
| 5,457,569 A | 10/1995 | Liou et al. |
| 5,458,995 A | 10/1995 | Behl et al. |
| 5,464,692 A | 11/1995 | Huber |
| 5,464,706 A | 11/1995 | Dasgupta et al. |
| 5,470,396 A | 11/1995 | Mongon et al. |
| 5,472,795 A | 12/1995 | Atita |
| 5,475,528 A | 12/1995 | LaBorde |
| 5,478,456 A | 12/1995 | Humpal et al. |
| 5,483,613 A | 1/1996 | Bruce et al. |
| 5,493,177 A | 2/1996 | Muller et al. |
| 5,498,489 A | 3/1996 | Dasgupta et al. |
| 5,499,207 A | 3/1996 | Miki et al. |
| 5,501,918 A | 3/1996 | Gruenstern et al. |
| 5,504,041 A | 4/1996 | Summerfelt |
| 5,512,147 A | 4/1996 | Bates et al. |
| 5,512,387 A | 4/1996 | Ovshinsky |
| 5,512,389 A | 4/1996 | Dasgupta et al. |
| 5,538,796 A | 7/1996 | Schaffer et al. |
| 5,540,742 A | 7/1996 | Sangyoji et al. |
| 5,547,780 A | 8/1996 | Kagawa et al. |
| 5,547,782 A | 8/1996 | Dasgupta et al. |
| 5,552,242 A | 9/1996 | Ovshinsky et al. |
| 5,555,127 A | 9/1996 | Abdelkader et al. |
| 5,561,004 A | 10/1996 | Bates et al. |
| 5,563,979 A | 10/1996 | Bruce et al. |
| 5,565,071 A | 10/1996 | Demaray et al. |
| 5,567,210 A | 10/1996 | Bates et al. |
| 5,569,520 A | 10/1996 | Bates |
| 5,582,935 A | 12/1996 | Dasgupta et al. |
| 5,591,520 A | 1/1997 | Migliorini et al. |
| 5,597,660 A | 1/1997 | Bates et al. |
| 5,597,661 A | 1/1997 | Takeuchi et al. |
| 5,599,355 A | 2/1997 | Nagasubramanian et al. |
| 5,601,952 A | 2/1997 | Dasgupta et al. |
| 5,603,816 A | 2/1997 | Demaray et al. |
| 5,607,560 A | 3/1997 | Hirabayashi et al. |
| 5,607,789 A | 3/1997 | Treger et al. |
| 5,612,152 A | 3/1997 | Bates |
| 5,612,153 A | 3/1997 | Moulton et al. |
| 5,613,995 A | 3/1997 | Bhandarkar et al. |
| 5,616,933 A | 4/1997 | Li |
| 5,618,382 A | 4/1997 | Mintz et al. |
| 5,625,202 A * | 4/1997 | Chai .............................. 257/94 |
| 5,637,418 A | 6/1997 | Brown et al. |
| 5,643,480 A | 7/1997 | Gustavsson et al. |
| 5,644,207 A | 7/1997 | Lew et al. |
| 5,645,626 A | 7/1997 | Edlund et al. |
| 5,645,960 A | 7/1997 | Scrosati et al. |
| 5,654,054 A | 8/1997 | Tropsha et al. |
| 5,654,984 A | 8/1997 | Hershbarger et al. |
| 5,658,652 A | 8/1997 | Sellergren |
| 5,660,700 A | 8/1997 | Shimizu et al. |
| 5,665,490 A | 9/1997 | Takeuchi et al. |
| 5,667,538 A | 9/1997 | Bailey |
| 5,677,784 A | 10/1997 | Harris |
| 5,679,980 A | 10/1997 | Summerfelt |
| 5,681,666 A | 10/1997 | Treger et al. |
| 5,686,360 A | 11/1997 | Harvey, III et al. |
| 5,689,522 A | 11/1997 | Beach |
| 5,693,956 A | 12/1997 | Shi et al. |
| 5,702,829 A | 12/1997 | Paidassi et al. |
| 5,705,293 A | 1/1998 | Hobson |
| 5,718,813 A | 2/1998 | Drummond |
| 5,719,976 A | 2/1998 | Henry et al. |
| 5,721,067 A | 2/1998 | Jacobs et al. |
| RE35,746 E | 3/1998 | Lake |
| 5,731,661 A | 3/1998 | So et al. |
| 5,738,731 A | 4/1998 | Shindo et al. |
| 5,742,094 A | 4/1998 | Ting |
| 5,755,938 A | 5/1998 | Fukui et al. |
| 5,755,940 A | 5/1998 | Shindo |
| 5,757,126 A | 5/1998 | Harvey, III et al. |
| 5,762,768 A | 6/1998 | Goy et al. |
| 5,763,058 A | 6/1998 | Isen et al. |
| 5,771,562 A | 6/1998 | Harvey, III et al. |
| 5,776,278 A | 7/1998 | Tuttle et al. |
| 5,779,839 A | 7/1998 | Tuttle et al. |
| 5,790,489 A | 8/1998 | O'Connor |
| 5,792,550 A | 8/1998 | Phillips et al. |
| 5,805,223 A | 9/1998 | Shikakura et al. |
| 5,811,177 A | 9/1998 | Shi et al. |
| 5,814,195 A | 9/1998 | Lehan et al. |
| 5,830,330 A | 11/1998 | Lantsman |
| 5,831,262 A | 11/1998 | Greywall et al. |
| 5,834,137 A | 11/1998 | Zhang et al. |
| 5,841,931 A | 11/1998 | Foresi et al. |
| 5,842,118 A | 11/1998 | Wood, Jr. |
| 5,845,990 A | 12/1998 | Hymer |
| 5,847,865 A | 12/1998 | Gopinath et al. |
| 5,849,163 A | 12/1998 | Ichikawa et al. |
| 5,851,896 A | 12/1998 | Summerfelt |
| 5,853,830 A | 12/1998 | McCaulley et al. |
| 5,855,744 A | 1/1999 | Halsey et al. |
| 5,856,705 A | 1/1999 | Ting |
| 5,864,182 A | 1/1999 | Matsuzaki |
| 5,865,860 A | 2/1999 | Delnick |
| 5,870,273 A | 2/1999 | Sogabe et al. |
| 5,874,184 A | 2/1999 | Takeuchi et al. |
| 5,882,721 A | 3/1999 | Delnick |
| 5,882,946 A | 3/1999 | Otani |
| 5,889,383 A | 3/1999 | Teich |
| 5,895,731 A | 4/1999 | Clingempeel |
| 5,897,522 A | 4/1999 | Nitzan |
| 5,900,057 A | 5/1999 | Buchal et al. |
| 5,909,346 A | 6/1999 | Malhotra et al. |
| 5,916,704 A | 6/1999 | Lewin et al. |
| 5,923,964 A | 7/1999 | Li |
| 5,930,046 A | 7/1999 | Solberg et al. |
| 5,930,584 A | 7/1999 | Sun et al. |
| 5,942,089 A | 8/1999 | Sproul et al. |
| 5,948,215 A | 9/1999 | Lantsman |
| 5,948,464 A | 9/1999 | Delnick |
| 5,948,562 A | 9/1999 | Fulcher et al. |
| 5,952,778 A | 9/1999 | Haskal et al. |
| 5,955,217 A | 9/1999 | Lerberghe |

| | | | |
|---|---|---|---|
| 5,961,672 A | 10/1999 | Skotheim et al. |
| 5,961,682 A | 10/1999 | Lee et al. |
| 5,966,491 A | 10/1999 | DiGiovanni |
| 5,970,393 A | 10/1999 | Khorrami et al. |
| 5,973,913 A | 10/1999 | McEwen et al. |
| 5,977,582 A | 11/1999 | Fleming et al. |
| 5,982,144 A | 11/1999 | Johnson et al. |
| 5,985,484 A | 11/1999 | Young et al. |
| 5,985,485 A | 11/1999 | Ovshinsky et al. |
| 6,000,603 A | 12/1999 | Koskenmaki et al. |
| 6,001,224 A | 12/1999 | Drummond et al. |
| 6,004,660 A | 12/1999 | Topolski et al. |
| 6,007,945 A | 12/1999 | Jacobs et al. |
| 6,013,949 A | 1/2000 | Tuttle |
| 6,019,284 A | 2/2000 | Freeman et al. |
| 6,023,610 A | 2/2000 | Wood, Jr. |
| 6,024,844 A | 2/2000 | Drummond et al. |
| 6,025,094 A | 2/2000 | Visco et al. |
| 6,028,990 A | 2/2000 | Shahani et al. |
| 6,030,421 A | 2/2000 | Gauthier et al. |
| 6,033,768 A | 3/2000 | Muenz et al. |
| 6,042,965 A | 3/2000 | Nestler et al. |
| 6,045,626 A | 4/2000 | Yano et al. |
| 6,045,652 A | 4/2000 | Tuttle et al. |
| 6,045,942 A | 4/2000 | Miekka et al. |
| 6,046,081 A | 4/2000 | Kuo |
| 6,048,372 A | 4/2000 | Mangahara et al. |
| 6,051,114 A | 4/2000 | Yao et al. |
| 6,051,296 A | 4/2000 | McCaulley et al. |
| 6,052,397 A | 4/2000 | Jeon et al. |
| 6,057,557 A | 5/2000 | Ichikawa |
| 6,058,233 A | 5/2000 | Dragone |
| 6,071,323 A | 6/2000 | Kawaguchi |
| 6,075,973 A | 6/2000 | Greeff et al. |
| 6,077,106 A | 6/2000 | Mish |
| 6,077,642 A | 6/2000 | Ogata et al. |
| 6,078,791 A | 6/2000 | Tuttle et al. |
| 6,080,508 A | 6/2000 | Dasgupta et al. |
| 6,080,643 A | 6/2000 | Noguchi et al. |
| 6,093,944 A | 7/2000 | VanDover |
| 6,094,292 A | 7/2000 | Goldner et al. |
| 6,096,569 A | 8/2000 | Matsuno et al. |
| 6,100,108 A | 8/2000 | Mizuno et al. |
| 6,106,933 A | 8/2000 | Nagai et al. |
| 6,110,531 A | 8/2000 | Paz De Araujo |
| 6,115,616 A | 9/2000 | Halperin et al. |
| 6,117,279 A | 9/2000 | Smolanoff et al. |
| 6,118,426 A | 9/2000 | Albert et al. |
| 6,120,890 A | 9/2000 | Chen et al. |
| 6,129,277 A | 10/2000 | Grant et al. |
| 6,133,670 A | 10/2000 | Rodgers et al. |
| 6,137,671 A | 10/2000 | Staffiere |
| 6,144,916 A | 11/2000 | Wood, Jr. et al. |
| 6,146,225 A | 11/2000 | Sheats et al. |
| 6,148,503 A | 11/2000 | Delnick et al. |
| 6,156,452 A | 12/2000 | Kozuki et al. |
| 6,157,765 A | 12/2000 | Bruce et al. |
| 6,159,635 A | 12/2000 | Dasgupta et al. |
| 6,160,373 A | 12/2000 | Dunn et al. |
| 6,162,709 A | 12/2000 | Raoux et al. |
| 6,165,566 A | 12/2000 | Tropsha |
| 6,168,884 B1 | 1/2001 | Neudecker et al. |
| 6,169,474 B1 | 1/2001 | Greeff et al. |
| 6,175,075 B1 | 1/2001 | Shiotsuka et al. |
| 6,176,986 B1 | 1/2001 | Watanabe et al. |
| 6,181,283 B1 | 1/2001 | Johnson et al. |
| 6,192,222 B1 | 2/2001 | Greeff et al. |
| 6,197,167 B1 | 3/2001 | Tanaka |
| 6,198,217 B1 | 3/2001 | Suzuki et al. |
| 6,204,111 B1 | 3/2001 | Uemoto et al. |
| 6,210,544 B1 | 4/2001 | Sasaki |
| 6,210,832 B1 | 4/2001 | Visco et al. |
| 6,214,061 B1 | 4/2001 | Visco et al. |
| 6,214,660 B1 | 4/2001 | Uemoto et al. |
| 6,218,049 B1 | 4/2001 | Bates et al. |
| 6,220,516 B1 | 4/2001 | Tuttle et al. |
| 6,223,317 B1 | 4/2001 | Pax et al. |
| 6,228,532 B1 | 5/2001 | Tsuji et al. |
| 6,229,987 B1 | 5/2001 | Greeff et al. |
| 6,232,242 B1 | 5/2001 | Hata et al. |
| 6,235,432 B1 | 5/2001 | Kono et al. |
| 6,236,793 B1 | 5/2001 | Lawrence et al. |
| 6,242,128 B1 | 6/2001 | Tura et al. |
| 6,242,129 B1 | 6/2001 | Johnson |
| 6,242,132 B1 | 6/2001 | Neudecker et al. |
| 6,248,291 B1 | 6/2001 | Nakagama et al. |
| 6,248,481 B1 | 6/2001 | Visco et al. |
| 6,248,640 B1 | 6/2001 | Nam |
| 6,249,222 B1 | 6/2001 | Gehlot |
| 6,252,564 B1 | 6/2001 | Albert et al. |
| 6,258,252 B1 | 7/2001 | Miyasaka et al. |
| 6,261,917 B1 | 7/2001 | Quek et al. |
| 6,264,709 B1 | 7/2001 | Yoon et al. |
| 6,265,652 B1 | 7/2001 | Kurata et al. |
| 6,268,695 B1 | 7/2001 | Affinito |
| 6,271,053 B1 | 8/2001 | Kondo |
| 6,271,793 B1 | 8/2001 | Brady et al. |
| 6,271,801 B2 | 8/2001 | Tuttle et al. |
| 6,280,585 B1 | 8/2001 | Obinata et al. |
| 6,280,875 B1 | 8/2001 | Kwak et al. |
| 6,281,142 B1 | 8/2001 | Basceri et al. |
| 6,284,406 B1 | 9/2001 | Xing et al. |
| 6,287,986 B1 | 9/2001 | Mihara |
| 6,289,209 B1 | 9/2001 | Wood, Jr. |
| 6,290,821 B1 | 9/2001 | McLeod |
| 6,290,822 B1 | 9/2001 | Fleming et al. |
| 6,291,098 B1 | 9/2001 | Shibuya et al. |
| 6,294,722 B1 | 9/2001 | Kondo et al. |
| 6,296,949 B1 | 10/2001 | Bergstresser et al. |
| 6,296,967 B1 | 10/2001 | Jacobs et al. |
| 6,296,971 B1 | 10/2001 | Hara |
| 6,300,215 B1 | 10/2001 | Shin |
| 6,302,939 B1 | 10/2001 | Rabin et al. |
| 6,306,265 B1 | 10/2001 | Fu et al. |
| 6,316,563 B2 | 11/2001 | Naijo et al. |
| 6,323,416 B1 | 11/2001 | Komori et al. |
| 6,324,211 B1 | 11/2001 | Ovard et al. |
| 6,325,294 B2 | 12/2001 | Tuttle et al. |
| 6,329,213 B1 | 12/2001 | Tuttle et al. |
| 6,339,236 B1 | 1/2002 | Tomii et al. |
| 6,344,366 B1 | 2/2002 | Bates |
| 6,344,419 B1 | 2/2002 | Forster et al. |
| 6,344,795 B1 | 2/2002 | Gehlot |
| 6,350,353 B2 | 2/2002 | Gopalraja et al. |
| 6,351,630 B2 | 2/2002 | Wood, Jr. |
| 6,356,230 B1 | 3/2002 | Greef et al. |
| 6,356,694 B1 | 3/2002 | Weber |
| 6,356,764 B1 | 3/2002 | Ovard et al. |
| 6,358,810 B1 | 3/2002 | Dornfest et al. |
| 6,360,954 B1 | 3/2002 | Barnardo |
| 6,361,662 B1 | 3/2002 | Chiba et al. |
| 6,365,300 B1 | 4/2002 | Ota et al. |
| 6,365,319 B1 | 4/2002 | Heath et al. |
| 6,368,275 B1 | 4/2002 | Sliwa et al. |
| 6,369,316 B1 | 4/2002 | Plessing et al. |
| 6,372,383 B1 | 4/2002 | Lee et al. |
| 6,372,386 B1 | 4/2002 | Cho et al. |
| 6,373,224 B1 | 4/2002 | Goto et al. |
| 6,375,780 B1 | 4/2002 | Tuttle et al. |
| 6,376,027 B1 | 4/2002 | Lee et al. |
| 6,379,835 B1 | 4/2002 | Kucherovsky et al. |
| 6,379,842 B1 | 4/2002 | Mayer |
| 6,379,846 B1 | 4/2002 | Terahara et al. |
| 6,380,477 B1 | 4/2002 | Curtin |
| 6,384,573 B1 | 5/2002 | Dunn |
| 6,387,563 B1 | 5/2002 | Bates |
| 6,391,166 B1 | 5/2002 | Wang |
| 6,392,565 B1 | 5/2002 | Brown |
| 6,394,598 B1 | 5/2002 | Kaiser |
| 6,395,430 B1 | 5/2002 | Cho et al. |
| 6,396,001 B1 | 5/2002 | Nakamura |
| 6,398,824 B1 | 6/2002 | Johnson |
| 6,399,241 B1 | 6/2002 | Hara et al. |
| 6,402,039 B1 | 6/2002 | Freeman et al. |
| 6,402,795 B1 | 6/2002 | Chu et al. |
| 6,402,796 B1 | 6/2002 | Johnson |
| 6,409,965 B1 | 6/2002 | Nagata et al. |
| 6,413,284 B1 | 7/2002 | Chu et al. |

| | | |
|---|---|---|
| 6,413,285 B1 | 7/2002 | Chu et al. |
| 6,413,382 B1 | 7/2002 | Wang et al. |
| 6,413,645 B1 | 7/2002 | Graff et al. |
| 6,413,676 B1 | 7/2002 | Munshi |
| 6,414,626 B1 | 7/2002 | Greef et al. |
| 6,416,598 B1 | 7/2002 | Sircar |
| 6,420,961 B1 | 7/2002 | Bates et al. |
| 6,422,698 B2 | 7/2002 | Kaiser |
| 6,423,106 B1 | 7/2002 | Bates |
| 6,423,776 B1 | 7/2002 | Akkapeddi et al. |
| 6,426,163 B1 | 7/2002 | Pasquier et al. |
| 6,432,577 B1 | 8/2002 | Shul et al. |
| 6,432,584 B1 | 8/2002 | Visco et al. |
| 6,433,380 B2 | 8/2002 | Shin |
| 6,433,465 B1 | 8/2002 | McKnight et al. |
| 6,436,156 B1 | 8/2002 | Wandeloski et al. |
| 6,437,231 B2 | 8/2002 | Kurata et al. |
| 6,444,336 B1 | 9/2002 | Jia et al. |
| 6,444,355 B1 | 9/2002 | Murai et al. |
| 6,444,368 B1 | 9/2002 | Hikmet et al. |
| 6,444,750 B1 | 9/2002 | Touhsaent |
| 6,459,418 B1 | 10/2002 | Comiskey et al. |
| 6,459,726 B1 | 10/2002 | Ovard et al. |
| 6,466,771 B2 | 10/2002 | Wood, Jr. |
| 6,475,668 B1 | 11/2002 | Hosokawa et al. |
| 6,481,623 B1 | 11/2002 | Grant et al. |
| 6,488,822 B1 | 12/2002 | Moslehi |
| 6,494,999 B1 | 12/2002 | Herrera et al. |
| 6,495,283 B1 | 12/2002 | Yoon et al. |
| 6,497,598 B2 | 12/2002 | Affinito |
| 6,500,287 B1 | 12/2002 | Azens et al. |
| 6,503,661 B1 | 1/2003 | Park et al. |
| 6,503,831 B2 | 1/2003 | Speakman |
| 6,506,289 B2 | 1/2003 | Demaray et al. |
| 6,511,516 B1 | 1/2003 | Johnson et al. |
| 6,511,615 B1 | 1/2003 | Dawes et al. |
| 6,517,968 B2 | 2/2003 | Johnson et al. |
| 6,522,067 B1 | 2/2003 | Graff et al. |
| 6,524,466 B1 | 2/2003 | Bonaventura et al. |
| 6,524,750 B1 | 2/2003 | Mansuetto |
| 6,525,976 B1 | 2/2003 | Johnson |
| 6,528,212 B1 | 3/2003 | Kusumoto et al. |
| 6,533,907 B2 | 3/2003 | Demaray et al. |
| 6,537,428 B1 | 3/2003 | Xiong et al. |
| 6,538,211 B2 | 3/2003 | St. Lawrence et al. |
| 6,541,147 B1 | 4/2003 | McLean et al. |
| 6,548,912 B1 | 4/2003 | Graff et al. |
| 6,551,745 B2 | 4/2003 | Moutsios et al. |
| 6,558,836 B1 | 5/2003 | Whitacre et al. |
| 6,562,513 B1 | 5/2003 | Takeuchi et al. |
| 6,563,998 B1 | 5/2003 | Farah et al. |
| 6,569,564 B1 | 5/2003 | Lane |
| 6,569,570 B1 | 5/2003 | Sonobe et al. |
| 6,570,325 B2 | 5/2003 | Graff et al. |
| 6,572,173 B2 | 6/2003 | Muller |
| 6,573,652 B1 | 6/2003 | Graff et al. |
| 6,576,546 B2 | 6/2003 | Gilbert et al. |
| 6,579,728 B2 | 6/2003 | Grant et al. |
| 6,582,480 B2 | 6/2003 | Pasquier et al. |
| 6,582,481 B1 | 6/2003 | Erbil |
| 6,582,852 B1 | 6/2003 | Gao et al. |
| 6,589,299 B2 | 7/2003 | Missling et al. |
| 6,593,150 B2 | 7/2003 | Ramberg et al. |
| 6,599,662 B1 | 7/2003 | Chiang et al. |
| 6,600,905 B2 | 7/2003 | Greeff et al. |
| 6,602,338 B2 | 8/2003 | Chen et al. |
| 6,603,139 B1 | 8/2003 | Tessler et al. |
| 6,603,391 B1 | 8/2003 | Greeff et al. |
| 6,605,228 B1 | 8/2003 | Kawaguchi et al. |
| 6,608,464 B1 | 8/2003 | Lew et al. |
| 6,610,440 B1 | 8/2003 | LaFollette et al. |
| 6,615,614 B1 | 9/2003 | Makikawa et al. |
| 6,616,035 B2 | 9/2003 | Ehrensvard et al. |
| 6,618,829 B2 | 9/2003 | Pax et al. |
| 6,620,545 B2 | 9/2003 | Goenka et al. |
| 6,622,049 B2 | 9/2003 | Penner et al. |
| 6,632,563 B1 | 10/2003 | Krasnov et al. |
| 6,637,906 B2 | 10/2003 | Knoerzer et al. |
| 6,637,916 B2 | 10/2003 | Mullner |
| 6,639,578 B1 | 10/2003 | Comiskey et al. |
| 6,645,675 B1 | 11/2003 | Munshi |
| 6,650,000 B2 | 11/2003 | Ballantine et al. |
| 6,650,942 B2 | 11/2003 | Howard et al. |
| 6,662,430 B2 | 12/2003 | Brady et al. |
| 6,664,006 B1 | 12/2003 | Munshi |
| 6,673,484 B2 | 1/2004 | Matsuura |
| 6,673,716 B1 | 1/2004 | D'Couto et al. |
| 6,674,159 B1 | 1/2004 | Peterson et al. |
| 6,677,070 B2 | 1/2004 | Kearl |
| 6,683,244 B2 | 1/2004 | Fujimori et al. |
| 6,683,749 B2 | 1/2004 | Daby et al. |
| 6,686,096 B1 | 2/2004 | Chung |
| 6,693,840 B2 | 2/2004 | Shimada et al. |
| 6,700,491 B2 | 3/2004 | Shafer |
| 6,706,449 B2 | 3/2004 | Mikhaylik et al. |
| 6,709,778 B2 | 3/2004 | Johnson |
| 6,713,216 B2 | 3/2004 | Kugai et al. |
| 6,713,389 B2 | 3/2004 | Speakman |
| 6,713,987 B2 | 3/2004 | Krasnov et al. |
| 6,723,140 B2 | 4/2004 | Chu et al. |
| 6,730,423 B2 | 5/2004 | Einhart et al. |
| 6,733,924 B1 | 5/2004 | Skotheim et al. |
| 6,737,197 B2 | 5/2004 | Chu et al. |
| 6,737,789 B2 | 5/2004 | Radziemski et al. |
| 6,741,178 B1 | 5/2004 | Tuttle |
| 6,750,156 B2 | 6/2004 | Le et al. |
| 6,752,842 B2 | 6/2004 | Luski et al. |
| 6,753,108 B1 | 6/2004 | Hampden-Smith et al. |
| 6,753,114 B2 | 6/2004 | Jacobs et al. |
| 6,760,520 B1 | 7/2004 | Medin et al. |
| 6,764,525 B1 | 7/2004 | Whitacre et al. |
| 6,768,246 B2 | 7/2004 | Pelrine et al. |
| 6,768,855 B1 | 7/2004 | Bakke et al. |
| 6,770,176 B2 | 8/2004 | Benson et al. |
| 6,773,848 B1 | 8/2004 | Nortoft et al. |
| 6,780,208 B2 | 8/2004 | Hopkins et al. |
| 6,797,428 B1 | 9/2004 | Skotheim et al. |
| 6,797,429 B1 | 9/2004 | Komatsu |
| 6,805,998 B2 | 10/2004 | Jenson et al. |
| 6,805,999 B2 | 10/2004 | Lee et al. |
| 6,818,356 B1 | 11/2004 | Bates |
| 6,822,157 B2 | 11/2004 | Fujioka |
| 6,824,922 B2 | 11/2004 | Park et al. |
| 6,827,826 B2 | 12/2004 | Demaray et al. |
| 6,828,063 B2 | 12/2004 | Park et al. |
| 6,828,065 B2 | 12/2004 | Munshi |
| 6,830,846 B2 | 12/2004 | Kramlich et al. |
| 6,835,493 B2 | 12/2004 | Zhang et al. |
| 6,838,209 B2 | 1/2005 | Langan et al. |
| 6,846,765 B2 | 1/2005 | Imamura et al. |
| 6,852,139 B2 | 2/2005 | Zhang et al. |
| 6,855,441 B1 | 2/2005 | Levanon |
| 6,861,821 B2 | 3/2005 | Masumoto et al. |
| 6,863,699 B1 | 3/2005 | Krasnov et al. |
| 6,866,901 B2 | 3/2005 | Burrows et al. |
| 6,866,963 B2 | 3/2005 | Seung et al. |
| 6,869,722 B2 | 3/2005 | Kearl |
| 6,884,327 B2 | 4/2005 | Pan et al. |
| 6,886,240 B2 | 5/2005 | Zhang et al. |
| 6,890,385 B2 | 5/2005 | Tsuchiya et al. |
| 6,896,992 B2 | 5/2005 | Kearl |
| 6,899,975 B2 | 5/2005 | Watanabe et al. |
| 6,902,660 B2 | 6/2005 | Lee et al. |
| 6,905,578 B1 | 6/2005 | Moslehi et al. |
| 6,906,436 B2 | 6/2005 | Jenson et al. |
| 6,911,667 B2 | 6/2005 | Pichler et al. |
| 6,916,679 B2 | 7/2005 | Snyder et al. |
| 6,921,464 B2 | 7/2005 | Krasnov et al. |
| 6,923,702 B2 | 8/2005 | Graff et al. |
| 6,924,164 B2 | 8/2005 | Jensen |
| 6,929,879 B2 | 8/2005 | Yamazaki |
| 6,936,377 B2 | 8/2005 | Wensley et al. |
| 6,936,381 B2 | 8/2005 | Skotheim et al. |
| 6,936,407 B2 | 8/2005 | Pichler |
| 6,949,389 B2 | 9/2005 | Pichler et al. |
| 6,955,986 B2 | 10/2005 | Li |
| 6,962,613 B2 | 11/2005 | Jenson |
| 6,962,671 B2 | 11/2005 | Martin et al. |

| Patent/Pub No. | Date | Inventor |
|---|---|---|
| 6,964,829 B2 | 11/2005 | Utsugi et al. |
| 6,982,132 B1 | 1/2006 | Goldner et al. |
| 6,986,965 B2 | 1/2006 | Jenson et al. |
| 6,994,933 B1 | 2/2006 | Bates |
| 7,022,431 B2 | 4/2006 | Shchori et al. |
| 7,033,406 B2 | 4/2006 | Weir et al. |
| 7,045,246 B2 | 5/2006 | Simburger et al. |
| 7,045,372 B2 | 5/2006 | Ballantine et al. |
| 7,056,620 B2 | 6/2006 | Krasnov et al. |
| 7,073,723 B2 | 7/2006 | Fürst et al. |
| 7,095,372 B2 | 8/2006 | Soler Castany et al. |
| 7,129,166 B2 | 10/2006 | Speakman |
| 7,131,189 B2 | 11/2006 | Jenson |
| 7,144,654 B2 | 12/2006 | LaFollette et al. |
| 7,144,655 B2 | 12/2006 | Jenson et al. |
| 7,157,187 B2 | 1/2007 | Jenson |
| 7,158,031 B2 | 1/2007 | Tuttle |
| 7,162,392 B2 | 1/2007 | Vock et al. |
| 7,183,693 B2 | 2/2007 | Brantner et al. |
| 7,186,479 B2 | 3/2007 | Krasnov et al. |
| 7,194,801 B2 | 3/2007 | Jenson et al. |
| 7,198,832 B2 | 4/2007 | Burrows et al. |
| 7,202,825 B2 | 4/2007 | Leizerovich et al. |
| 7,220,517 B2 | 5/2007 | Park et al. |
| 7,230,321 B2 | 6/2007 | McCain |
| 7,247,408 B2 | 7/2007 | Skotheim et al. |
| 7,253,494 B2 | 8/2007 | Mino et al. |
| 7,265,674 B2 | 9/2007 | Tuttle |
| 7,267,904 B2 | 9/2007 | Komatsu et al. |
| 7,267,906 B2 | 9/2007 | Mizuta et al. |
| 7,273,682 B2 | 9/2007 | Park et al. |
| 7,274,118 B2 | 9/2007 | Jenson et al. |
| 7,288,340 B2 | 10/2007 | Iwamoto |
| 7,316,867 B2 | 1/2008 | Park et al. |
| 7,323,634 B2 | 1/2008 | Speakman |
| 7,332,363 B2 | 2/2008 | Edwards |
| 7,335,441 B2 | 2/2008 | Luski et al. |
| RE40,137 E | 3/2008 | Tuttle et al. |
| 7,345,647 B1 | 3/2008 | Rodenbeck |
| 7,348,099 B2 | 3/2008 | Mukai et al. |
| 7,389,580 B2 | 6/2008 | Jenson et al. |
| 7,400,253 B2 | 7/2008 | Cohen |
| 7,410,730 B2 | 8/2008 | Bates |
| RE40,531 E | 10/2008 | Graff et al. |
| 7,468,221 B2 | 12/2008 | LaFollette et al. |
| 7,494,742 B2 | 2/2009 | Tarnowski et al. |
| 7,670,724 B1 | 3/2010 | Chan et al. |
| 2001/0005561 A1 | 6/2001 | Yamada et al. |
| 2001/0027159 A1 | 10/2001 | Kaneyoshi |
| 2001/0031122 A1 | 10/2001 | Lackritz et al. |
| 2001/0032666 A1 | 10/2001 | Jenson et al. |
| 2001/0033952 A1 | 10/2001 | Jenson et al. |
| 2001/0034106 A1 | 10/2001 | Moise et al. |
| 2001/0041294 A1 | 11/2001 | Chu et al. |
| 2001/0041460 A1 | 11/2001 | Wiggins |
| 2001/0052752 A1 | 12/2001 | Ghosh et al. |
| 2001/0054437 A1 | 12/2001 | Komori et al. |
| 2001/0055719 A1 | 12/2001 | Akashi et al. |
| 2002/0000034 A1 | 1/2002 | Jenson |
| 2002/0001746 A1 | 1/2002 | Jenson |
| 2002/0001747 A1 | 1/2002 | Jenson |
| 2002/0004167 A1 | 1/2002 | Jenson et al. |
| 2002/0009630 A1 | 1/2002 | Gao et al. |
| 2002/0019296 A1 | 2/2002 | Freeman et al. |
| 2002/0028377 A1 | 3/2002 | Gross |
| 2002/0033330 A1 | 3/2002 | Demaray et al. |
| 2002/0037756 A1 | 3/2002 | Jacobs et al. |
| 2002/0066539 A1 | 6/2002 | Muller |
| 2002/0067615 A1 | 6/2002 | Muller |
| 2002/0071989 A1 | 6/2002 | Verma et al. |
| 2002/0076133 A1 | 6/2002 | Li et al. |
| 2002/0091929 A1 | 7/2002 | Ehrensvard |
| 2002/0093029 A1 | 7/2002 | Ballantine et al. |
| 2002/0106297 A1 | 8/2002 | Ueno et al. |
| 2002/0110733 A1* | 8/2002 | Johnson ............ 429/149 |
| 2002/0115252 A1 | 8/2002 | Haukka et al. |
| 2002/0134671 A1 | 9/2002 | Demaray et al. |
| 2002/0139662 A1 | 10/2002 | Lee |
| 2002/0140103 A1 | 10/2002 | Kloster et al. |
| 2002/0159245 A1 | 10/2002 | Murasko et al. |
| 2002/0161404 A1 | 10/2002 | Schmidt |
| 2002/0164441 A1 | 11/2002 | Amine et al. |
| 2002/0170821 A1 | 11/2002 | Sandlin et al. |
| 2002/0170960 A1 | 11/2002 | Ehrensvard et al. |
| 2003/0019326 A1 | 1/2003 | Han et al. |
| 2003/0022487 A1 | 1/2003 | Yoon et al. |
| 2003/0024994 A1 | 2/2003 | Ladyansky |
| 2003/0029493 A1 | 2/2003 | Plessing |
| 2003/0035906 A1 | 2/2003 | Memarian et al. |
| 2003/0036003 A1 | 2/2003 | Shchori et al. |
| 2003/0042131 A1 | 3/2003 | Johnson |
| 2003/0044665 A1 | 3/2003 | Rastegar et al. |
| 2003/0048635 A1 | 3/2003 | Knoerzer et al. |
| 2003/0063883 A1 | 4/2003 | Demaray et al. |
| 2003/0064292 A1 | 4/2003 | Neudecker et al. |
| 2003/0068559 A1 | 4/2003 | Armstrong et al. |
| 2003/0077914 A1 | 4/2003 | Le et al. |
| 2003/0079838 A1 | 5/2003 | Brcka |
| 2003/0091904 A1 | 5/2003 | Munshi |
| 2003/0095463 A1 | 5/2003 | Shimada et al. |
| 2003/0097858 A1 | 5/2003 | Strohhofer et al. |
| 2003/0109903 A1 | 6/2003 | Berrang et al. |
| 2003/0127319 A1 | 7/2003 | Demaray et al. |
| 2003/0134054 A1 | 7/2003 | Demaray et al. |
| 2003/0141186 A1 | 7/2003 | Wang et al. |
| 2003/0143853 A1 | 7/2003 | Celii et al. |
| 2003/0146877 A1 | 8/2003 | Mueller |
| 2003/0152829 A1 | 8/2003 | Zhang et al. |
| 2003/0162094 A1 | 8/2003 | Lee et al. |
| 2003/0173207 A1 | 9/2003 | Zhang et al. |
| 2003/0173208 A1 | 9/2003 | Pan et al. |
| 2003/0174391 A1 | 9/2003 | Pan et al. |
| 2003/0175142 A1 | 9/2003 | Milonopoulou et al. |
| 2003/0178623 A1 | 9/2003 | Nishiki et al. |
| 2003/0178637 A1 | 9/2003 | Chen et al. |
| 2003/0180610 A1 | 9/2003 | Felde et al. |
| 2003/0185266 A1 | 10/2003 | Henrichs |
| 2003/0231106 A1 | 12/2003 | Shafer |
| 2003/0232248 A1 | 12/2003 | Iwamoto et al. |
| 2004/0008587 A1 | 1/2004 | Siebott et al. |
| 2004/0015735 A1 | 1/2004 | Norman |
| 2004/0023106 A1 | 2/2004 | Benson et al. |
| 2004/0028875 A1 | 2/2004 | Van Rijn et al. |
| 2004/0029311 A1 | 2/2004 | Snyder et al. |
| 2004/0038050 A1 | 2/2004 | Saijo et al. |
| 2004/0043557 A1 | 3/2004 | Haukka et al. |
| 2004/0048157 A1 | 3/2004 | Neudecker et al. |
| 2004/0058237 A1 | 3/2004 | Higuchi et al. |
| 2004/0077161 A1 | 4/2004 | Chen et al. |
| 2004/0078662 A1 | 4/2004 | Hamel et al. |
| 2004/0081415 A1 | 4/2004 | Demaray et al. |
| 2004/0081860 A1 | 4/2004 | Hundt et al. |
| 2004/0085002 A1 | 5/2004 | Pearce |
| 2004/0101761 A1 | 5/2004 | Park et al. |
| 2004/0105644 A1 | 6/2004 | Dawes |
| 2004/0106038 A1 | 6/2004 | Shimamura et al. |
| 2004/0106045 A1* | 6/2004 | Ugaji et al. ............ 429/321 |
| 2004/0106046 A1 | 6/2004 | Inda |
| 2004/0118700 A1 | 6/2004 | Schierle-Arndt et al. |
| 2004/0126305 A1 | 7/2004 | Chen et al. |
| 2004/0151986 A1 | 8/2004 | Park et al. |
| 2004/0161640 A1 | 8/2004 | Salot |
| 2004/0175624 A1 | 9/2004 | Luski et al. |
| 2004/0188239 A1 | 9/2004 | Robison et al. |
| 2004/0209159 A1 | 10/2004 | Lee et al. |
| 2004/0214079 A1 | 10/2004 | Simburger et al. |
| 2004/0219434 A1 | 11/2004 | Benson et al. |
| 2004/0245561 A1 | 12/2004 | Sakashita et al. |
| 2004/0258984 A1 | 12/2004 | Ariel et al. |
| 2004/0259305 A1 | 12/2004 | Demaray et al. |
| 2005/0000794 A1 | 1/2005 | Demaray et al. |
| 2005/0006768 A1 | 1/2005 | Narasimhan et al. |
| 2005/0048802 A1 | 3/2005 | Zhang et al. |
| 2005/0070097 A1 | 3/2005 | Barmak et al. |
| 2005/0072458 A1 | 4/2005 | Goldstein |
| 2005/0079418 A1 | 4/2005 | Kelley et al. |
| 2005/0095506 A1 | 5/2005 | Klaassen |
| 2005/0105231 A1 | 5/2005 | Hamel et al. |

| | | | | | | |
|---|---|---|---|---|---|---|
| 2005/0110457 | A1 | 5/2005 | LaFollette et al. | DE | 10 2008 016 665 | 10/2008 |
| 2005/0112461 | A1 | 5/2005 | Amine et al. | DE | 102007030604 | 1/2009 |
| 2005/0118464 | A1 | 6/2005 | Levanon | EP | 0 510 883 A2 | 10/1992 |
| 2005/0130032 | A1 | 6/2005 | Krasnov et al. | EP | 0 639 655 A1 | 2/1995 |
| 2005/0133361 | A1 | 6/2005 | Ding et al. | EP | 0 652 308 A2 | 5/1995 |
| 2005/0141170 | A1 | 6/2005 | Honda et al. | EP | 0 820 088 A2 | 1/1998 |
| 2005/0142447 | A1 | 6/2005 | Nakai et al. | EP | 1 068 899 A1 | 1/2001 |
| 2005/0147877 | A1 | 7/2005 | Tarnowski et al. | EP | 0 0867 985 B1 | 2/2001 |
| 2005/0158622 | A1 | 7/2005 | Mizuta et al. | EP | 1 092 689 A1 | 4/2001 |
| 2005/0170736 | A1 | 8/2005 | Cok | EP | 1 189 080 A2 | 3/2002 |
| 2005/0175891 | A1 | 8/2005 | Kameyama et al. | EP | 1 713 024 | 10/2006 |
| 2005/0176181 | A1 | 8/2005 | Burrows et al. | FR | 2806198 | 9/2001 |
| 2005/0181280 | A1 | 8/2005 | Ceder et al. | FR | 2 861 218 | 4/2005 |
| 2005/0183946 | A1 | 8/2005 | Pan et al. | JP | 55-009305 | 1/1980 |
| 2005/0189139 | A1 | 9/2005 | Stole | JP | 56-076060 | 6/1981 |
| 2005/0208371 | A1 | 9/2005 | Kim et al. | JP | 56-156675 | 12/1981 |
| 2005/0239917 | A1 | 10/2005 | Nelson et al. | JP | 60-068558 | 4/1985 |
| 2005/0266161 | A1 | 12/2005 | Medeiros et al. | JP | 61-269072 | 11/1986 |
| 2006/0019504 | A1 | 1/2006 | Taussig | JP | 62-267944 | 11/1987 |
| 2006/0021214 | A1 | 2/2006 | Jenson et al. | JP | 63-290922 | 11/1988 |
| 2006/0040177 | A1 | 2/2006 | Onodera et al. | JP | 2000-162234 | 11/1988 |
| 2006/0046907 | A1 | 3/2006 | Rastegar et al. | JP | 2-054764 A2 | 2/1990 |
| 2006/0054496 | A1 | 3/2006 | Zhang et al. | JP | 2-230662 | 9/1990 |
| 2006/0057283 | A1 | 3/2006 | Zhang et al. | JP | 03-036962 | 2/1991 |
| 2006/0057304 | A1 | 3/2006 | Zhang et al. | JP | 4-058456 | 2/1992 |
| 2006/0063074 | A1 | 3/2006 | Jenson et al. | JP | 4-072049 | 3/1992 |
| 2006/0071592 | A1 | 4/2006 | Narasimhan et al. | JP | 6-010127 A | 1/1994 |
| 2006/0155545 | A1 | 7/2006 | Jayne | JP | 6-100333 A | 4/1994 |
| 2006/0201583 | A1 | 9/2006 | Michaluk et al. | JP | 7-233469 A | 5/1995 |
| 2006/0210779 | A1 | 9/2006 | Weir et al. | JP | 7-224379 A | 8/1995 |
| 2006/0222954 | A1 | 10/2006 | Skotheim et al. | JP | 08-114408 | 5/1996 |
| 2006/0234130 | A1 | 10/2006 | Inda | JP | 10-026571 | 1/1998 |
| 2006/0237543 | A1 | 10/2006 | Goto et al. | JP | 10-239187 | 9/1998 |
| 2006/0255435 | A1 | 11/2006 | Fuergut et al. | JP | 11-204088 | 7/1999 |
| 2006/0286448 | A1 | 12/2006 | Snyder et al. | JP | 2000-144435 | 5/2000 |
| 2007/0009802 | A1 | 1/2007 | Lee et al. | JP | 2000-188099 | 7/2000 |
| 2007/0023275 | A1 | 2/2007 | Tanase et al. | JP | 2000-268867 | 9/2000 |
| 2007/0037058 | A1 | 2/2007 | Visco et al. | JP | 2001-171812 | 6/2001 |
| 2007/0053139 | A1 | 3/2007 | Zhang et al. | JP | 2001-259494 | 9/2001 |
| 2007/0087230 | A1 | 4/2007 | Jenson et al. | JP | 2001-297764 | 10/2001 |
| 2007/0091543 | A1 | 4/2007 | Gasse et al. | JP | 2001-328198 | 11/2001 |
| 2007/0125638 | A1 | 6/2007 | Zhang et al. | JP | 2002-140776 | 5/2002 |
| 2007/0141468 | A1 | 6/2007 | Barker | JP | 2002-344115 | 11/2002 |
| 2007/0148065 | A1 | 6/2007 | Weir et al. | JP | 2003-17040 | 1/2003 |
| 2007/0148553 | A1 | 6/2007 | Weppner | JP | 2003-347045 | 12/2003 |
| 2007/0151661 | A1 | 7/2007 | Mao et al. | JP | 2004-071305 | 3/2004 |
| 2007/0164376 | A1 | 7/2007 | Burrows et al. | JP | 2004-149849 | 5/2004 |
| 2007/0166612 | A1 | 7/2007 | Krasnov et al. | JP | 2004-158268 | 6/2004 |
| 2007/0184345 | A1 | 8/2007 | Neudecker et al. | JP | 2004-273436 | 9/2004 |
| 2007/0196682 | A1 | 8/2007 | Visser et al. | JP | 2005-256101 | 9/2005 |
| 2007/0202395 | A1 | 8/2007 | Snyder et al. | JP | 2002-026412 | 2/2007 |
| 2007/0205513 | A1 | 9/2007 | Brunnbauer et al. | JP | 7-107752 | 4/2007 |
| 2007/0210459 | A1 | 9/2007 | Burrows et al. | KR | 20020027881 | 1/2002 |
| 2007/0222681 | A1 | 9/2007 | Greene et al. | KR | 20020017790 | 3/2002 |
| 2007/0224951 | A1 | 9/2007 | Gilb et al. | KR | 20020029813 | 4/2002 |
| 2007/0235320 | A1 | 10/2007 | White et al. | KR | 20020038917 | 5/2002 |
| 2007/0264564 | A1 | 11/2007 | Johnson et al. | KR | 20030033913 | 5/2003 |
| 2007/0278653 | A1 | 12/2007 | Brunnbauer et al. | KR | 20030042288 | 5/2003 |
| 2007/0298326 | A1 | 12/2007 | Angell et al. | KR | 20030085252 | 11/2003 |
| 2008/0003496 | A1 | 1/2008 | Neudecker et al. | RU | 2241281 | 11/2004 |
| 2008/0008936 | A1 | 1/2008 | Mizuta et al. | WO | WO 9513629 | 5/1995 |
| 2008/0014501 | A1 | 1/2008 | Skotheim et al. | WO | WO 9623085 A1 | 8/1996 |
| 2008/0057397 | A1 | 3/2008 | Skotheim et al. | WO | WO 9623217 | 8/1996 |
| 2008/0213672 | A1 | 9/2008 | Skotheim et al. | WO | WO 9727344 | 7/1997 |
| 2008/0233708 | A1 | 9/2008 | Hisamatsu | WO | WO 9735044 A1 | 9/1997 |
| 2008/0254575 | A1 | 10/2008 | Fuergut et al. | WO | WO 9847196 | 10/1998 |
| 2008/0261107 | A1 | 10/2008 | Snyder et al. | WO | WO 9943034 | 8/1999 |
| 2008/0263855 | A1 | 10/2008 | Li et al. | WO | WO 9957770 | 11/1999 |
| 2008/0286651 | A1 | 11/2008 | Neudecker et al. | WO | WO 0021898 A1 | 4/2000 |
| 2009/0181303 | A1 | 7/2009 | Neudecker et al. | WO | WO 0022742 A2 | 4/2000 |
| 2009/0302226 | A1* | 12/2009 | Schieber et al. ......... 250/370.02 | WO | WO 0028607 | 5/2000 |
| 2010/0032001 | A1 | 2/2010 | Brantner | WO | WO 0036665 A1 | 6/2000 |
| 2010/0086853 | A1 | 4/2010 | Venkatachalam et al. | WO | WO 0060682 | 10/2000 |
| | | | | WO | WO 0060689 | 10/2000 |
| | | FOREIGN PATENT DOCUMENTS | | WO | WO 0062365 | 10/2000 |
| CN | | 1532984 | 9/2004 | WO | WO 0101507 | 1/2001 |
| DE | | 19824145 | 12/1999 | WO | WO 0117052 | 3/2001 |
| DE | 10 2005 014 427 | | 9/2006 | WO | WO 0124303 | 4/2001 |
| DE | 10 2006 054 309 | | 11/2006 | WO | WO 0133651 | 5/2001 |

| | | |
|---|---|---|
| WO | WO 0139305 | 5/2001 |
| WO | WO 0173864 | 10/2001 |
| WO | WO 0173865 | 10/2001 |
| WO | WO 0173866 | 10/2001 |
| WO | WO 0173868 | 10/2001 |
| WO | WO 0173870 | 10/2001 |
| WO | WO 0173883 | 10/2001 |
| WO | WO 0173957 | 10/2001 |
| WO | WO 0182390 | 11/2001 |
| WO | WO 0212932 A2 | 2/2002 |
| WO | WO 0242516 | 5/2002 |
| WO | WO 0247187 | 6/2002 |
| WO | WO 02071506 | 9/2002 |
| WO | WO 02101857 | 12/2002 |
| WO | WO 03003485 | 1/2003 |
| WO | WO 03005477 | 1/2003 |
| WO | WO 03026039 | 3/2003 |
| WO | WO 03036670 | 5/2003 |
| WO | WO 03069714 | 8/2003 |
| WO | WO 03080325 | 10/2003 |
| WO | WO 03083166 | 10/2003 |
| WO | WO 2004012283 | 2/2004 |
| WO | WO 2004021532 A1 | 3/2004 |
| WO | WO 2004061887 | 7/2004 |
| WO | WO 2004077519 A2 | 9/2004 |
| WO | WO 2004086550 | 10/2004 |
| WO | WO 2004093223 | 10/2004 |
| WO | WO 2004106581 A2 | 12/2004 |
| WO | WO 2004106582 A2 | 12/2004 |
| WO | WO 2005008828 | 1/2005 |
| WO | WO 2005013394 | 2/2005 |
| WO | WO 2005038957 | 4/2005 |
| WO | WO 2005067645 | 7/2005 |
| WO | WO 2005085138 | 9/2005 |
| WO | WO 2005091405 | 9/2005 |
| WO | WO 2006063308 A2 | 6/2006 |
| WO | 2006/085307 * | 8/2006 |
| WO | WO 2006085307 | 8/2006 |
| WO | WO 2007016781 | 2/2007 |
| WO | WO 2007019855 | 2/2007 |
| WO | WO 2007027535 | 3/2007 |
| WO | WO 2009027535 | 3/2007 |
| WO | WO 2007095604 | 8/2007 |
| WO | WO 2008036731 | 3/2008 |

OTHER PUBLICATIONS

Hwang et al., "Characterization of sputter-deposited LiMn2O4 thin films for rechargeable microbatteries," 141(12) J. Electrochem. Soc. 3296-99 (1994).
Wang, B. et al., "Characterization of Thin-Film Rechargeable Lithium Batteries with Lithium Cobalt Oxide Cathodes," J. Electrochem. Soc. 143:3203-13 (1996).
Marques, P.V.S. et al., "Planar Silica-on-Silicon Waveguides Lasers Based in Two Layers Core Devices," 10$^{th}$ European Conference on Integrated Optics, Session WeB2, pp. 79-82 (2001).
Meijerink, A. et al., "Luminescence of Ag$^+$ in Crystalline and Glassy Srb$_4$O$_7$," J. Physics Chem. Solids 54(8):901-906 (1993).
Mesnaoui, M. et al, "Spectroscopic properties of Ag$^+$ ions in phosphate glasses of NaPO$_3$-AgPO$_3$ system," Eur. J. Solid State Inorg. Chem. 29:1001-1013 (1992).
Mitomi, O. et al., "Design of a Single-Mode Tapered Waveguide for Low-Loss Chip-to-Fiber Coupling," IEEE J. Quantum Electronics 30(8): 1787-1793 (1994).
Mizuno, Y. et al "Temperature dependence of oxide decomposition on titanium surfaces in UHV," J. Vac. Sci & Tech. A. 20(5): 1716-1721 (2002).
Ohkubo, H. et al., Polarization-Insensitive Arrayed-Waveguide Grating Using Pure SiO$_2$ Cladding Fifth Optoelectronics and Communication Conference (OECC 2000) Technical Digest, pp. 366-367 (2000).
Ohmi, S. et al., "Rare earth mental oxides for high-K fate insulator," VLSI Design 2004, 1 Page (2004).
Ohtsuki, T., et al., "Gain Characteristics of high concentration Er$_{3+}$-doped phosphate glass waveguide," J. Appl. Phys. 78(6):3617-3621 (1996).
Ono, H. et al., "Design of a Low-loss Y-branch Optical Waveguide," Fifth Optoelectronic and Communications Conference (OECC 2000) Technical Digest, pp. 502-503 (2000).
Padmini, P. et al. "Realization of High Tunability Barium Strontium Titanate Thin Films by rf Megnetron Sputtering," Appl. Phys. Lett. 75(20):3186-3188 (1999).
Pan, T. et al., "Planar Er$_{3+}$-doped aluminosilicate waveguide amplifier with more than 10 dB gain across C-band," Optical Society of America, 3 pages (2000).
Park et al., "Characteristics of Pt Thin Film on the Conducting Ceramics TiO and Ebonex (Ti$_4$O$_7$) as Electrode Materials," Thin Solid Films 258: 5-9 (1995).
Peters, D.P. et al., "Formation mechanism of silver nanocrystals made by ion irradiation of Na$_+$—Ag$^+$ ion-exchanged sodalime silicate glass," Nuclear Instruments and Methods in Physics Research B 168:237-244 (2000).
Rajarajan, M. et al., "Numerical Study of Spot-Size Expanders fro an Efficient OEIC to SMF Coupling," IEEE Photonics Technology Letters 10(8): 1082-1084 (1998).
Ramaswamy, R.V. et al., "Ion-Exchange Glass Waveguides: A Review," J. Lightwave Technology 6(6): 984-1002 (1988).
Roberts, S.W. et al., "The Photoluminescence of Erbium-doped Silicon Monoxide," University of Southampton , Department of Electronics and Computer Science Research Journal, 7 pages (1996).
Saha et al., "Large Reduction of Leakage Current by Graded-Layer La Doping in (Ba0.5,Sr0.5)TiO3 Thin Films," Appl. Phys. Lett. 79(1): 111-113 (Jul. 2001).
Sanyo Vacuum Industries Co., Ltd. Products Inofr, TiO$_2$, (2003), 1 page http://www.sanyovac.co.jp/Englishweb/products?ETiO2.htm.
Schermer, R. et al., "Investigation of Mesa Dielectric Waveguides," Proceedings of the OSA Integrated Photonics Research Topical Meeting and Exhibit, Paper No. IWB3, 3 pages (2001).
Schiller, S. et al., "PVD Coating of Plastic Webs and Sheets with High Rates on Large Areas," European Materials Research Society 1999 Spring Meeting, Jun. 1-4, 1999, Strasbourg, France, 13 pages (1999).
Scholl, R., "Power Supplies for Pulsed Plasma Technologies: State-of-the-Art and Outlook," Advances Energy Industries, Inc. 1-8 (1999).
Scholl, R., "Power Systems for Reactive Sputtering of Insulating Films," Advances Energy Industries, Inc., 1-8 (Aug. 2001).
Second International Symposium of Polymer Surface Modification: Relevance to Adhesion, Preliminary Program, 13 pages (1999).
Seventh International Conference on TiO$_2$ Photocatalysis: Fundamentals & Applications, Toronto, Ontario, Canada, Final Program, 7 pages (Nov. 17-21, 2002).
Sewell, P. et al., "Rib Waveguides Spot-Size Transformers: Modal Properties," J Lightwave Technology 17(5):848-856 (1999).
Shaw, D.G. et al., "Use of Vapor Deposited Acrylate Coatings to Improve the Barrier Properties of Metallized Film," Society of Vacuum Coaters, 37$^{th}$ Annual Technical Conference Proceedings, pp. 240-244 (1994).
Shin, J.C. et al., "Dielectric and Electrical Properties of Sputter Grown (Ba,Se)TiO$_3$ Thin Films," J. Appl. Phys. 86(1):506-513 (1999).
Shmulovich, J. et al., "Recent progress in Erbium-doped waveguide amplifiers," Bell Laboratories, pp. 35-37 (1999).
Slooff, L.H. et al., "Optical properties of Erbium-doped organic polydentate cage complexes," J. Appl. Phys. 83(1):497-503 (1998).
Smith, R.E. et al., "Reduced Coupling Loss Using a Tapered-Rib Adiabatic-Following Fiber Coupler," IEEE Photonics Technology Lett. 8(8):1052-1054 (1996).
Snoeks, E. et al., "Cooperative upconversion in erbium-implanted soda-lime silicate glass optical waveguides," J. Opt. Soc. Am. B 12(8): 1468-1474 (1995).
Strohhofer, C. and Polman, A. "Energy tranfer to Er$^{3+}$ in Ag ion-exchanged glass," FOM Institute for Atomic and Molecular Physics, 10 pages (2001).
Sugiyama, A. et al., "Gas Permeation Through the Pinholes of Plastic Film Laminated with Aluminum Foil," Vuoto XXVIII(1-2):51-54 (1999).
Tervonen, A. "Challenges and opportunities for integrated optics in optical networks," SPIE 3620:2-11 (1999).

Ting, C.Y. et al., "Study of planarized sputter-deposited SiO$_2$," J. Vac. Sci Technol, 15(3):1105-1112 (1078).

Tomaszewski, H. et al., "Yttria-stabilized zirconia thin films grown by reactive r.f. magnetron sputtering," Thin Solid Films 287: 104-109 (1996).

Triechel, O. and Kirchhoff, V., "The influences of pulsed magnetron sputtering on topography and crystallinity of TiO$_2$ films on glass," Surface and Coating Technology 123:268-272 (2000).

Tukamoto, H. and West, A.R., "Electronic Conductivity of LiCoO$_s$ and Its Enhancement by Magnesium Doping," J. Electrochem. Soc 144(9):3164-3168 (1997).

Van Dover, R.B., "Amorphous Lanthanide-Doped TiO$_x$ Dielectrics Films," Appl. Phys. Lett. 74(20):3041-3043 (1999).

Viljanen, J. Leppihalme, M., "Planner Optical Coupling Elements for Multimode Fibers with Two=Step Ion Migration Process," Applied Physics 24(1):61-63 (1981).

Villegas, M.A. et al., "Optical spectroscopy of a soda lime glass exchanged with silver," Phys. Chem. Glasses 37(6):248-253 (1996).

Von Rottkay, K. et al., "Influence of stoichiometry on electrochromic cerium-titanium oxide compounds," Presented at the 11$^{th}$ Int'l Conference of Solids State Ionics, Honolulu, Hawaii, Nov. 19, 1997, Published in Solid State Ionics 113-115:425-430. (1998).

E-Tek website: FAQ, Inside E-Tek, E-TEk News, Products; http://www.etek-inc.com/, 10 pages. (2003).

Flytzanis, C. et al., "Nonlinear optics in composite materials," in Progress in Optics XXIX, Elsevier Science Publishers B.V., pp. 323-425 (1991).

Frazao, O. et al., "EDFA gain flattening using long-period fibre gratings based on the electric arc technique," Proc. London Comm. Symp. 2001, London, England, 3 pages (2001).

Fujii, M. et al., "1.54 µm photoluminescence of Er$^{3+}$ doped into SiO$_2$ films containing Si nanocrystals: evidence for energy transfer from Si nanocrystals for Er$^{3+}$," Appl. Phys. Lett. 71(9): 1198-1200 (1997).

Garcia, C. et al., "Size dependence of lifetime and absorption cross section of Si nanocrystals embedded in SiO$_2$," Appl. Phys. Lett. 82(10): 1595-1597 (2003).

Goossens, A. et al., "Sensitization of TiO$_2$ with p-type semiconductor polymers," Chem. Phys. Lett. 287: 148 (1998).

Greene, J.E. et al., "Morphological and electrical properties of rf sputtered Y$_2$O$_3$-doped ZrO$_2$ thin films," J. Vac. Sci. Tech. 13(1): 72-75 (1976).

Han, H.-S. et al., "Optical gain at 1.54 µm in Erbium-doped Silicon nanocluster sensitized waveguide," Appl. Phys. Lett. 79(27): 4568-4570 (2001).

Hayakawa, T. et al., "Enhanced fluorescence from Eu$^{3+}$ owing to surface plasma oscillation of silver particles in glass," J. Non-Crystalline Solids 259: 16-22 (1999).

Hayakawa, T. et al., "Field enhancement effect of small Ag particles on the fluorescence from Eu$^{3+}$-doped SiO$_2$ glass," Appl. Phys. Lett. 74(11): 1513-1515 (1999).

Hayfield, P.C.S., I Development of a New Material-Monolithic Ti$_4$O$_7$ Ebonix® Ceramic, Royal Society of Chemistry, Cambridge, Table of Contents, 4 pages. (2002).

Hehlen, M.P. et al., "Spectroscopic properties of Er$^{3+}$- and Yb$^{3+}$-doped soda-lime silicate and aluminosilicate glasses," Physical Review B 56(15): 9302-9318 (1997).

Hehlen, M.P. et al., "Uniform upconversion in high-concentration Er$^{3+}$-doped soda lime silicate and aluminosilicate glasses," Optics Letters 22(11); 772-774 (1997).

Horst, F. et al., "Compact, tunable optical devices in silicon-oxynitride waveguide technology," Top. Meeting Integrated Photonics Res. '00, Quebec, Canada, p. IThF1, 3 pages (2000).

Howson, R.P., "The reactive sputtering of oxides and nitrides," Pure & Appl. Chem. 66(6): 1311-1318 (1994).

Hubner, J. and Guldberg-Kjaer, S., "Planar Er- and Yb-doped amplifiers and lasers," COM Technical University of Denmark, 10$^{th}$ European Conf. on Integrated Optics, Session WeB2, pp. 71-74 (2001).

Hwang, M-S. et al., "The effect of pulsed magnetron sputtering on the properties of iridium tin oxide thin films," Surface and Coatings Tech. 171: 29-33 (2003).

IM, J.S. and Sposili, R.S., "Crystalline Si films for integrated active-matrix liquid crystal displays," MRS Bulletin, pp. 39-48 (1996).

IM, J.S. et al., "Controlled super-lateral growth of Si-films for microstructural manipulation and optimization," Physica Status Solidi (A) 166(2): 603-617 (1998).

IM, J.S. et al., "Single-crystal Si films for thin-film transistor devices," Appl. Physics Lett. 70(25): 3434-3436 (1997).

Itoh, M. et al., "Large reduction of singlemode-fibre coupling loss in 1.5% Δ planar lightwave circuits using spot-size converters," Electronics Letters 38(2): 72-74 (2002).

Jackson, M.K. and Movassaghi, M., "An accurate compact EFA model," Eur. Conf. Optical Comm., Munich, Germany, 2 pages (2000).

Janssen, R. et al., "Photoinduced electron transfer from conjugated polymers onto nanocrystalline TiO$_2$," Synthet. Metal., 1 page (1999).

Johnson, J.E. et al., "Monolithically integrated semiconductor optical amplifier and electroabsorption modulator with dual-waveguide spot-size converter input," IEEE J. Selected topics in Quantum Electronics 6(1): 19-25 (2000).

Jonsson, L.B. et al., "Frequency response in pulsed DC reactive sputtering processes," Thin Solid Films 365: 43-48 (2000).

Kato, K. and Inoue, Y., "Recent progress on PLC hybrid integration," SPIE 3631: 28-36 (1999).

Kato, K. and Tohmori, Y., "PLC hybrid integration technology and its application to photonic components," IEEE J. Selected Topics in Quantum Electronics 6(1): 4-13 (2000).

Kelly, P.J. and Arnell, R.D., "Control of the structure and properties of aluminum oxide coatings deposited by pulsed magnetron sputtering," J. Vac. Sci. Technol. A 17(3): 945-953 (1999).

Kelly, P.J. et al., "A novel technique for the deposition of aluminum-doped zinc oxide films," Thin Solid Films 426(1-2): 111-116 (2003).

Kelly, P.J. et al., "Reactive pulsed magnetron sputtering process for alumina films," J. Vac. Sci. Technol. A 18(6): 2890-2896 (2000).

Kik, P.G. and Polman, A., "Gain limiting processes in Er-doped Si nanocrystal waveguides in SiO$_2$," J. Appl. Phys. 91(1): 536-536 (2002).

Kim et al., "Correlation Between the Microstructures and the Cycling Performance of RuO$_2$ Electrodes for Thin-Film Microsupercapacitros," J. Vac. Sci, Technol. B20(5): 1827-1832 (Sep. 2002).

Kim, D-W. et al. "Mixture Behavior and Microwave Dielectric Properties in the Low-fired TiO$_2$-CuO System," Jpn. J. Appl. Phys. 39:2696-2700 (2000).

Kim, H-K. et al., "Characteristics of rapid-thermal-annealed LiCoO2 cathode film for an all-solid-state thin film microbattery," J. Vac. Sci. Technol. A 22(4): 1182-1187 (2004).

Kim, J-Y. et al. "Frequency-dependent pulsed direct current magnetron sputtering of titanium oxide films," J. Vac. Sci. Technol. A 19(2):429-434 (2001).

Ladouceur, F. and Love, J.D., in: Silica-based Buried Channel Waveguides and Devices, Chapman & Hall, London, Table of Contents, 6 pages (1996).

Ladouceur, F. et al., "Effect of side wall roughness in buried channel waveguides," IEEE Proc. Optoelectron. 141(4):242-248 (1994).

Lamb, W. and Zeiler, R., Designing Non-Foil Containing Skins for Vacuum Insulation Panel (VIP) Application, Vuoto XXVIII(1-2):55-58 (1999).

Lamb, W.B., "Designing Nonfoil Containing Skins for VIP Applications," DuPont VIA Symposium Presentation, 35 Pages (1999).

Lange, M.R. et al, "High Gain Ultra-Short Length Phosphate glass Erbium-Doped Fiber Amplifier Material," OSA Optical Fiber Communications (OFC), 3 Pages (2002).

Laporta, P. et al, "Diode-pumped cw bulk Er:Yb: glass laser," Optics Letters 16(24):1952-1954 (1991).

Laurent-Lund, C. et al., "PECVD Grown Mulitple Core Planar Wageguides with Extremely Low Interface Reflections and Losses," IEEE Photonics Tech. Lett. 10(10):1431-1433 (1998).

Lee, B.H. et al., "Effects of interfacial layer growth on the electrical characteristics of thin titanium oxide films on silion," Appl. Phys. Lett. 74(21):3143-3145 (1999).

Lee, K.K. et al., "Effect of size and roughness on light transmission in a Si/SiO$_2$ waveguide: Experiments and model," Appl. Phys. Lett. 77(11):1617-1619 (2000).

Love, J.D. et al., "Quantifying Loss Minimisation in Single-Mode Fibre Tapers," Electronics Letters 22(17):912-914 (1986).

Mardare, D. and Rusu, G.I., "On the structure of Titanium Oxide Thin Films," Andalele Stiintifice Ale Universitatii IASI, Romania, pp. 201-208 (1999).

Affinito, J.D. et al., "PML/oxide/PML barrier layer performance differences arising from use of UV or electron beam polymerization of the PML layers," Thin Solid Films 308-309: 19-25 (1997).

Affinito, J.D. et al., "Polymer-oxide transparent barrier layers," Society of Vacuum Coaters, $39^{th}$ Ann. Technical Conference Proceedings, May 5-10, 1996, Philadelphia, PA, pp. 392-397 (1996).

Alder, T. et al., "High-efficiency fiber-to-chip coupling using low-loss tapered single-mode fiber," IEEE Photonics Tech. Lett. 12(8): 1016-1018 (2000).

Almeida, V.R. et al., "Nanotaper for compact mode conversion," Optics Letters 28(15): 1302-1304 (2003).

Anh et al., "Significant Suppression of Leakage Current in $(Ba,Sr)TiO_3$ Thin Films by Ni or Mn Doping," J. Appl. Phys.,92(5): 2651-2654 (Sep. 2002).

Asghari, M. and Dawnay, E., "ASOC™—a manufacturing integrated optics technology," SPIE 3620: 252-262 (Jan. 1999).

Barbier, D. et al., "Amplifying four-wavelength combiner, based on erbium/ytterbium-doped waveguide amplifiers and integrated splitters," IEEE Photonics Tech. Lett. 9:315-317 (1997).

Barbier, D., "Perfomances and potential applications of erbium doped planar waveguide amplifiers and lasers," Proc. OAA, Victoria, BC, Canada, pp. 58-63 (Jul. 21-23, 1997).

Beach R.J., "Theory and optimization of lens ducts," Applied Optics 35(12): 2005-2015 (1996).

Belkind, A. et al., "Pulsed-DC Reactive Sputtering of Dielectrics: Pulsing Parameter Effects," $43^{rd}$ Annual Technical Conference Proceedings.

Belkind, A. et al., "Using pulsed direct current power for reactive sputtering of $Al_2O_3$," J. Vac. Sci, Technol. A 17(4): 1934-1940 (1999).

Bestwick, T., "ASOC™ silicon integrated optics technology," SPIE 3631: 182-190 (1999).

Borsella, E. et al., "Structural incorporation of silver in soda-lime glass by the ion-exchange process: a photoluminescence spectroscopy study," Applied Physics A 71: 125-132 (2000).

Byer, R.L., "Nonlinear optics and solid-state lasers: 2000," IEEE J. Selected Topics in Quantum Electronics 6(6): 911-930 (2000).

Campbell, S.A. et al., "Titanium dioxide (TiO2)-based gate insulators," IBM J. Res. Develop. 43(3): 383-392 (1999).

Chang, C.Y. and Sze, S.M. (eds.), in ULSI Technology, The McGraw-Hill Companies, Inc., Nyew York, Chapter 4, pp. 169-170 and 226-231 (1996).

Chen, G. et al., "Development of supported bifunctional electrocatalysts for unitized regenerative fuel cells," J. Electrochemical Society 149(8): A1092-A1099 (2002).

Choi, Y.B. et al., "Er-Al-codoped silicate planar light waveguide-type amplifier fabricated by radio-frequency sputtering," Optics Letters 25(4): 263-265 (2000).

Choy et al., "Eu-Doped Y2O3 Phosphor Films Produced by Electrostatic-Assisted Chemical Vapor Deposition," J. Mater. Res. 14(7): 3111-3114 (Jul. 1999).

Cocorullo, G. et al., "Amorphous silicon waveguides and light modulators for integrated photonics realized by low-temperature plasma-enhanced chemical-vapor deposition," Optics Lett. 21(24): 2002-2004 (1996).

Cooksey, K. et al., "Predicting permeability & Transmission rate for multilayer materials," Food Technology 53(9): 60-63 (1999).

Crowder, M.A. et al., "Low-temperature single-crystal Si TFT's fabricated on Si films processed via sequential lateral solidification," IEEE Electron Device Lett. 19(8): 306-308 (1998).

Delavaux, J-M. et al., "Integrated optics erbium ytterbium amplifier system in 10Gb/s fiber transmission experiment," $22^{nd}$ European Conference on Optical Communication, Osla, I.123-I.126 (1996).

Distributed Energy Resources: Fuel Cells, Projects, 4 pages http://www.eere.energy.gov/der/fuel_cells/projects.html (2003).

Dorey, R.A., "Low temperature micromoulding of functional ceramic devices," Grant summary for GR/S84156/01 for the UK Engineering and Physical Sciences Research Council, 2 pages (2004).

DuPont Teijin Films, Mylar 200 SBL 300, Product Information, 4 pages (2000).

Electrometals Technologies Limited, Financial Report for 2002, Corporate Directory, Chairman's review, Review of Operations, 10 pages (2002).

International Search Report issued Mar. 26, 2008 in International Application No. PCT/US07/83879.

Dobkin, D.M., "Silicon Dioxide: Properties and Applications".

Westlinder, J. et al., "Simulations and Dielectric Characterization of Reactive dc Magnetron Cosputtered $(Ta_2O_5)_{1-x}(TiO_2)_x$ Thin Films," J Vac. Sci. Technol. B 20(3):855-861 (May/Jun. 2002).

Wilkes, K.E., "Gas Permeation Through Vacuum Barrier Films and its Effect on VIP Thermal Performance," presented at the Vacuum Insulation Panel Symp., Baltimore, Maryland, 21 pages (May 3, 1999).

Yanagawa, H. et al., "Index-and-Dimensional Taper and Its Application to Photonic Devices," J. Lightwave Technology 10(5):587-591 (1992).

Yoshikawa, K. et al., "Spray formed aluminum alloys for sputtering targets," Powder Metallurgy 43(3): 198-199 (2000).

Zhang, H. et al., "High Dielectric Strength, High k $TiO_2$ Films by Pulsed DC, Reactive Sputter Deposition," 5 pages (2001).

Abraham, K.M. et al., "Inorganic-organic composite solid polymer electrolytes," 147(4) J. Electrochem. Soc. 1251-56 (2000).

Abrahams, I., "$Li_6Zr_2O_7$, a new anion vacancy ccp based structure, determined by ab initio powder diffraction methods," 104 J. Solid State Chem. 397-403 (1993).

Amatucci, G. et al., "Lithium scandium phosphate-based electrolytes for solid state lithium rechargeable microbatteries," 60 Solid State Ionics 357-65 (1993).

Appetecchi, G.B. et al., "Composite polymer electrolytes with improved lithium metal electrode interfacial properties," 145(12) J. Electrochem. Soc. 4126-32 (1998).

Bates, J.B. et al., "Electrical properties of amorphous lithium electrolyte thin films," 53-56 Solid State Ionics 647-54 (1992).

Delmas, C. et al., "Des conducteurs ioniques pseudo-bidimensionnels $Li_8MO_6$ (M=Zr, Sn), $Li_7LO_6$ (L=Nb, Ta) et $Li_6In_2O_6$," 14 Mat. Res. Bull. 619-25 (1979).

Hu, Y-W. et al., "Ionic conductivity of lithium phosphate-doped lithium orthosilicate," 11 Mat. Res. Bull. 1227-30 (1976).

Neudecker, B. et al., "$Li_9SiAlO_8$: a lithium ion electrolyte for voltages above 5.4 V," 143(7) J. Electrochem. Soc. 2198-203 (1996).

Ohno, H. et al., "Electrical conductivity of a sintered pellet of octalithium zirconate," 132 J. Nucl. Mat. 222-30 (1985).

Scholder, V. et al., "Über Zirkonate, Hafnate und Thorate von Barium, Strontium, Lithium und Natrium," Zeitschrift für Anorganische und Allgemeine Chemie, Band 362, pp. 149-168 (1968).

Yu, X. et al., "A stable thin-film lithium electrolyte: lithium phosphorus oxynitride," 144(2) J. Electrochem. Soc. 524-532 (1997).

Sarro, P., "Silicon Carbide as a New MEMS Technology," Sensors and Actuators 82, 210-218 (2000).

Hwang et al., "Characterization of Sputter-Deposited $LiMn_2O_4$ Thin Films for Rechargeable Microbatteries," 141(12) J. Electrochem. Soc. 3296-99 (1994).

Jones et al., 53-56 Solid State Ionics 628 (1992).

Mattox "Handbook of Physical Vapor Deposition (PVD) Processing, Society of Vacuum Coaters," Albuquerque, New Mexico 660f and 692ff, Noyes Publications (1998).

Hill, R. et al., "LargeArea Deposition by Mid-Frequency AC Sputternig," Society of Vacuum Coaters, $41^{st}$ Annual Tech. Conference Proceedings, 197-202 (1998).

Macák, Karol et al, "Ionized Sputter Deposition Using an Extremely High Plasma Density Pulsed Magnetron Discharge," J. Vac. Sci. Technol. A 18(4):1533-37 (2000).

Balanis, Constantine A., "Antenna Theory: Analysis and Design," 3rd Ed., pp. 817-820 (John Wiley & Sons, Inc. Publication, 2005).

* cited by examiner

SPUTTERING TARGET OF $LI_3PO_4$ AND METHOD FOR PRODUCING SAME

RELATED APPLICATIONS

This application is related to and claims the benefit under 35 U.S.C. §119 of U.S. provisional application Ser. No. 60/864,755, entitled "SPUTTERING TARGET OF $Li_3PO_4$ AND METHOD FOR PRODUCING SAME," filed on Nov. 7, 2006, which is incorporated herein by reference in its entirety.

FIELD OF THE INVENTION

The present invention is related to the fabrication and manufacture of thin-film solid-state batteries and, in particular, for example, the formation of a dense, single phase sputter target of lithium orthophosphate, $Li_3PO_4$, for reactive sputter deposition of a film or layer of lithium phosphorus oxynitride, known in the literature as LIPON, that may be utilized as an electrolyte, separator, or dielectric layer inside a thin-film battery or any other charge storage device structure, such as capacitors.

BACKGROUND OF THE INVENTION

Solid-state thin-film batteries are typically formed by stacking thin films on a substrate in such a way that the films cooperate to generate a voltage. The thin films typically include current collectors, a positive cathode, a negative anode, and an electrolyte film. The cathode and the electrolyte can be deposited utilizing a number of vacuum deposition processes, including physical vapor deposition, which includes evaporation and sputtering. Other methods of deposition include chemical vapor deposition and electroplating.

In a thin-film battery configuration, the cathode layer is separated from the anode layer by the insulating layer of solid electrolyte material. This electrolyte layer provides two functions. The first function is to conduct the electrochemically active ions between the cathode and the anode. The second function is to prevent the direct exchange of electrons between the cathode and the anode so that the electronic current becomes available only in the external circuit. In the case of a lithium based battery which comprises, for example, lithium (metal anode) batteries, lithium ion (anode) batteries, and lithium-free (anode) batteries, the electrochemically active ion that is exchanged is the Lithium+1 ion or the $Li^+$ ion. In U.S. Pat. No. 5,597,660 to John B. Bates, Jan. 28, 1997, it is reported, "Most critical to battery performance is the choice of electrolyte. It is known that the principal limitation on recharge ability of prior batteries is failure of the electrolyte. Battery failure after a number of charge-discharge cycles and the loss of charge on standing is caused by reaction between the anode and the electrolyte, e.g. attack of the lithium anode on the lithium electrolyte in lithium batteries." (Bates, column 2, lines 10-16).

The use of lithium phosphorus oxynitride is well known in the literature as LIPON and suitable for the formation of the solid thin film electrolyte layer in such devices. See, for instance, U.S. Pat. No. 5,569,520, Apr. 30, 1996 and U.S. Pat. No. 5,597,660, Jan. 28, 1997, issued to John B. Bates and N. J. Dudney. The resulting LIPON film was found to be stable in contact with the lithium anode. Perhaps as important, Bates et al. reported that incorporation of nitrogen into lithium orthophosphate films increased their $Li^+$ ion conductivity up to 2.5 orders of magnitude.

Both U.S. Pat. Nos. 5,569,520 and 5,597,660 disclose the formation of amorphous lithium phosphorus oxynitride electrolyte films deposited over the cathode by sputtering $Li_3PO_4$, lithium orthophosphate, in a nitrogen atmosphere. Both patents teach that the targets were prepared by cold pressing of lithium orthophosphate powder followed by sintering of the pressed disc in air at 900° C. In each patent, deposition of a 1 micron thick film was carried out over a period of 16-21 hours at an average rate of 8-10 Angstroms per minute. The resulting film composition was $Li_xPO_yN_z$ where x has approximate value 2.8, while 2y+3z equals about 7.8, and z has an approximate value of 0.16 to 0.46.

There were two shortcomings with regard to the sputter target disclosed by Bates, et al. One was the low rate of deposition. In part, the low deposition rate is a result of an inherent low sputter rate of a low density target material. In addition, high sputter rates also require high sputter power, which was not, or could not be applied. The other shortcoming is the presence of impurity phases in the lithium orthophosphate target material. These impurity phases can cause plasma instability, as reported by other workers for other sputter target materials. Also, the impurity phases that were likely present in the method taught by Bates could have weakened the sputter target and caused target cracking at higher sputter powers. Hence, high power and high rate deposition were not often possible with sputter targets having these impurities in the target material.

High density ceramic bodies or tiles of the lithium orthophosphate material suitable as sputtering target have been demonstrated by at least two methods: sintering and hot pressing. However, due to the large number of known oxides of phosphorus, targets that are commercially available have been shown by the present research and investigation to be rich in at least one or more impurity phases, such as $Li_4P_2O_7$, which is deficient in lithium oxide ($Li_2O$) as informally described by $L_4P_2O_7=Li_3PO_4\bullet LiPO_3$ where $LiPO_3=Li_3PO_4-Li_2O$. Such compound and concentration variations of the impurity phases inside the parent material $Li_3PO_4$ due to presently available commercial manufacturing methods cause undesirable variations in the properties of the sputter target. These impurities cause plasma instability and target damage. For instance, they weaken the mechanical integrity of the sputter target, which is then prone to flaking and cracks. A weakened target can lead to particle generation, which, in turn, is built into the deposited film as defects. Impurities also weaken the sputter target through the formation of separated or agglomerated regions of higher or lower physical properties, such as density, elastic modulus, or color. At a given sputter power level these regions exhibit different sputter rates and sputtered composition compared with the surrounding sputter target areas. This scenario results in off-stoichiometric and non-uniform films. In particular, the impurity $Li_4P_2O_7$ is deficient in lithium (oxide), which causes the deposited lithium phosphorus oxynitride film to be deficient in lithium. In that case, the Bates patent describes x of $Li_x$-$PO_yN_z$ equal to 2.8, and this patent is not specific regarding the actual ratio of lithium to phosphorus. Due to these process variations and defects caused by multi phase sputter targets, the deposited films display particle defects that typically result in electrical shorting of the thin-film battery. The same holds true if LIPON was used as the dielectric in a capacitor. The deposited films also show variation in chemical composition and poor uniformity. As a result, solid state batteries containing the subject LIPON electrolyte sputtered from multi phase lithium orthophosphate targets have poor yields and very low manufacturing rates. Furthermore, such films have not been practically manufacturable and therefore have remained only a scientific and engineering curiosity. Hence, mass produced batteries, typical of other vacuum thin film manufactured products such as semiconductor chips or LCD display panels, have not been made available for use with solid state batteries that first require generally defect free, uniform LIPON electrolyte films.

Lithium phosphorus oxynitride films must be chemically inert to the other layers present in thin film solid state batteries, capacitors and memory devices. Thin film batteries equipped with such an electrolyte are known to offer many benefits of high recharge cycle life, low impedance for fast charging and discharging, and high temperature operation such as 150° C. or even higher. Thin film batteries using lithium phosphorus oxynitride electrolytes can be made very small and thin, while providing high energy storage density when configured with thin film lithium cobalt oxide cathode layers.

Although, experimental batteries fabricated with lithium phosphorus oxynitride electrolyte layer have been reported, no commercial devices are generally available today due to the difficulty in sputtering from a lithium orthophosphate ceramic sputter target material formed by prior art methods. The industry has difficulty producing commercial thin film batteries with a lithium phosphorus oxynitride thin-film electrolyte for two major reasons. The first reason is that efficient sputtering of pure materials to form films or layers on a substrate cannot be accomplished economically from low density targets. The second reason is that sputter targets including more than one phase possess physical properties such as strength, elastic modulus, hardness, chemical composition, thermal conductivity, dielectric strength and even color that vary widely over the target surface. At a given power level the different phases of the target material will sputter at different rates, leading to non uniform erosion of the sputter target and non-uniform properties of the sputtered film. Moreover, commercial lithium orthophosphate targets evaluated were found to contain one or more impurity phases as discussed further below.

U.S. Pat. No. 5,435,826 by M. Sakakibara and H. Kikuchi discloses a method of forming a dense, single phase sputtering target of indium-tin oxide for sputtering an indium tin oxide layer or film by a particular method of sintering under particular high temperature and time conditions. In the '826 patent, a single phase sputter target having a density of 93% or more while containing a second impurity phase with a concentration of less than 10% is discussed. Sakakibara et. al. discloses the plasma instabilities that arise with multiphase targets as well as the high quality oxide film that can be made from the sputter target having both high density and high single phase composition.

Accordingly, there remains is a need for uniform high density commercial lithium orthophosphate targets. Therefore, there is also a need for a method of forming a dense, single phase sputter target of lithium orthophosphate that allows for deposition of a high quality LIPON layer at high rates of deposition.

SUMMARY OF THE INVENTION

Various aspects and embodiments of the present invention, as described in more detail and by example below, address certain of the shortfalls of the background technology and emerging needs in the relevant industries. Accordingly, the present invention is directed, for example, to a sputter target and a method of forming a sputter target that substantially obviate one or more of the shortcomings or problems due to the limitations and disadvantages of the related art.

In one aspect of an embodiment of the invention, a sputter target may be formed from single phase lithium orthophosphate material into a high density, uniform ceramic body comprised of pure lithium orthophosphate without the formation of impurity phases. The sputter target fabricated from such body is suitable for the deposition of LIPON films. Some exemplary embodiments of the invention address the need for a sputter target to deposit LIPON films utilized as the electrolyte layer in a solid state rechargeable lithium based battery or other charge storage or charge transfer device.

In another aspect of an embodiment of the invention, a method of forming a high density, single phase sputter target of $Li_3PO_4$ includes a first step of refining a powder of pure $Li_3PO_4$, a second step of densifying the powder by cold isostatic pressing (CIP) to form the powder into an initial consolidated lithium orthophosphate material body (green body), degassing the consolidated material, and hot isostatic pressing (HIP) the degassed ceramic body into an initial lithium orthophosphate material body to form a dense ceramic body or material of single phase lithium orthophosphate.

In yet another aspect of an embodiment of the invention, an HIP process is performed for about 2 hours above 10 kpsi at a temperature less than about less than about 850° C. to form a 95% to 99% dense ceramic body or material of single phase lithium orthophosphate.

In another aspect of an embodiment of the invention, a dense ceramic body or material of single phase lithium orthophosphate is formed into a sputter target used to deposit a layer of LIPON onto a substrate.

Another aspect of an embodiment of the invention involves fabricating single phase lithium orthophosphate sputter targets by adding appropriate small amounts of pure $Li_2O$ powder to powder of pure $Li_3PO_4$ to thermodynamically prevent the formation of the predominant impurity phase $Li_4P_2O_7$ during a heating step. This approach is to be understood from the point that $Li_4P_2O_7$ is a lithium orthophosphate derivative, which is deficient in lithium oxide ($Li_2O$), as informally described by $Li_4P_2O_7=Li_3PO_4\bullet LiPO_3$ wherein $LiPO_3=Li_3PO_4-Li_2O$. The appropriate small amounts of $Li_2O$ powder will further counteract the loss of any $Li_2O$ during the sputter target fabrication process described above through pushing the thermodynamic equilibrium of the following chemical reaction to the side of the pure $Li_3PO_4$: $Li_4P_2O_7+Li_2O=2\ Li_3PO_4$.

Another aspect of an embodiment of the invention, a battery structure may be formed inside a vacuum deposition system using the lithium orthophosphate sputter target to form the thin-film electrolyte layer of said battery structure.

Another aspect of an embodiment of the invention is a method of producing a battery inside a vacuum deposition system. It includes: 1) loading a substrate into the vacuum deposition system; 2) depositing an optional barrier layer onto the substrate in one vacuum chamber; 3) depositing an optional conducting layer over the substrate or over the optional barrier layer inside the vacuum chamber or inside a different vacuum chamber of the vacuum deposition system; 4) depositing a $LiCoO_2$ layer over the optional barrier layer or the optional conducting layer inside the vacuum chamber or inside a different vacuum chamber of the vacuum deposition system; 5) depositing a LIPON electrolyte layer over the $LiCoO_2$ layer inside the vacuum chamber or inside a different vacuum chamber of the vacuum deposition system; 6) depositing an anode layer over the LIPON electrolyte layer inside the vacuum chamber or inside a different vacuum chamber of the vacuum deposition system; and 7) depositing an optional, second conducting layer over the anode layer inside vacuum chamber or inside a different vacuum chamber of the vacuum deposition system.

In another aspect of an embodiment of the invention, a step of refining a powder of pure $Li_3PO_4$ refines the powder to a mesh size of 250 mesh.

In still another aspect of an embodiment of the invention, densification of the pure lithium orthophosphate powder may be carried out in a CIP process resulting in a consolidated material body (green body) that exhibits approximately 50% of the theoretical density of lithium orthophosphate.

In yet another aspect of an embodiment of the invention, degasification of the consolidated material may be carried out at a temperature between 400° C. to 550° C. in a suitable steel vessel.

Another aspect of an embodiment of the invention includes performing an HIP process in a lined and scaled steel vessel at pressures of well above 10 kpsi and at a temperature less than about 850° C. for about 2 hours to form a 95% to 99% dense ceramic body or material of single phase lithium orthophosphate.

These and further embodiments are further discussed below with respect to the following figures.

BRIEF DESCRIPTION OF THE DRAWINGS

Some features and advantages of the invention are described with reference to the drawings of certain preferred embodiments, which are intended to illustrate and not to limit the invention.

The accompanying drawings, which are included to provide a further understanding of the invention and are incorporated in and constitute a part of this specification, illustrate exemplary embodiments of the invention that together with the description serve to explain the principles of the invention. In the drawings.

DETAILED DESCRIPTION OF THE PREFERRED EMBODIMENTS

These and other aspects of the invention will now be described in greater detail in connection with exemplary embodiments that are illustrated in the accompanying drawings.

It is to be understood that the present invention is not limited to the particular methodology, compounds, materials, manufacturing techniques, uses, and applications described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. Unless the context of the disclosure or claims dictate otherwise, for example, the terms "target" and "target title" maybe used interchangeably.

All patents and other publications identified are incorporated herein by reference for the purpose of describing and disclosing, for example, the methodologies described in such publications that might be used in connection with the present invention. These publications are provided solely for their disclosure prior to the filing date of the present application. Nothing in this regard should be construed as an admission that the inventors are not entitled to antedate such disclosure by virtue of prior invention or for any other reason.

According to embodiments of the present invention, it can be seen that process conditions similar to those described by Sakakibara et al. (U.S. Pat. No. 5,435,826, discussed above) and other methods currently researched and disclosed for formation of the predominantly single phase indium tin oxide target are not useful and do not lead to acceptable single phase, high density targets of lithium orthophosphate. Indeed, it is not clear, for a given material, that even a pure powder of a pure composition can be densified suitably for the purpose of sputtering without forming secondary or impurity phases. In some cases, pressure causes the formation of new chemical phases or the loss of a portion of the starting material as it transforms into another compound or chemical phase. In some other cases, temperature will result in similar transformations or degeneration of phase purity. Additionally, phase diagrams for ternary compounds of lithium, oxygen and phosphorus are known for only a few conditions of constant temperature or pressure. In addition to the under-oxidized phosphite anion $(PO_3)^{3-}$, wherein the phosphorus adopts the +3 oxidation state, there are more anionic species known in which the phosphorus assumes other well known states such as +5 (phosphates; $(PO_4)^{3-}$) and +1 (hypo-phosphites; $(PO_2)^{3-}$) or −3 (phosphonium compounds; $(PH_4)^+$).

In accordance with some embodiments of the present invention, a sputter target of $Li_3PO_4$ having a density very close to the theoretical density of 2.48 g/cm$^3$ can be formed. Sputter targets that are currently available, particularly those of a densified ceramic or vitreous material, are often of low density because of the incorporation of voids and porosity during the fabrication process from power feedstock or other low density starting material. As a dense target is sputtered, the surface of the target may remain continuous and display a surface of constant roughness or even become smoother under the influence of the sputter process, which is a process for the direct atomization or vaporization of the sputter target directly from the solid state. In this process, the material of the target is deposited on a substrate by the condensation of the vapor on the substrate to be coated. Less dense targets may become rougher as the porosity is exposed by continuous removal of the surface during the sputtering process, which in turn can increase the porosity thereby fueling the surface roughening. This situation can create a vicious cycle of a runaway degradation of the target surface. Plasma instability may result at the asperities of the rough surface. Roughening leads to flaking-off of particulate material from the rough target surface. These particles produced from the rough surface may contribute to defects or particle occlusions in the deposited film. For example, electrolyte films infected with a particle occlusion may exhibit a film discontinuity or pinhole defect under, above or around the occlusion. This occlusion can lead to undesirable results, such as short-circuiting a battery through reaction of the cathode material with the anode material, which may come into contact with each other at the discontinuity or pinhole defect in the electrolyte film. Analogous effects also may occur in other device films, such as capacitor dielectrics.

Figure 3A:
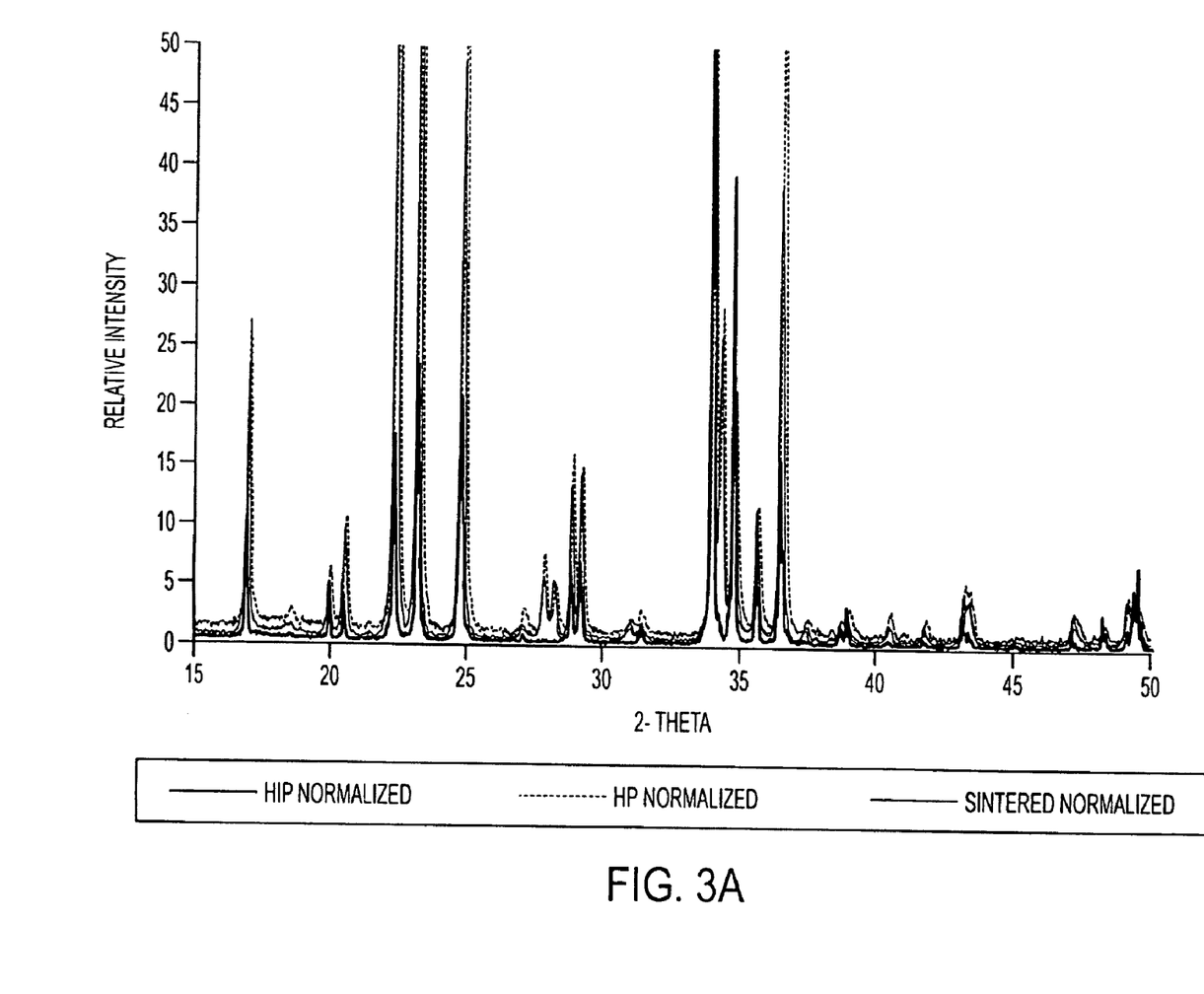
FIG. 3A illustrates the x-ray diffraction (XRD) analysis of two commercial target samples of lithium orthophosphate and a hot isostatically pressed ("HIPed") sample.
Figure 3B:
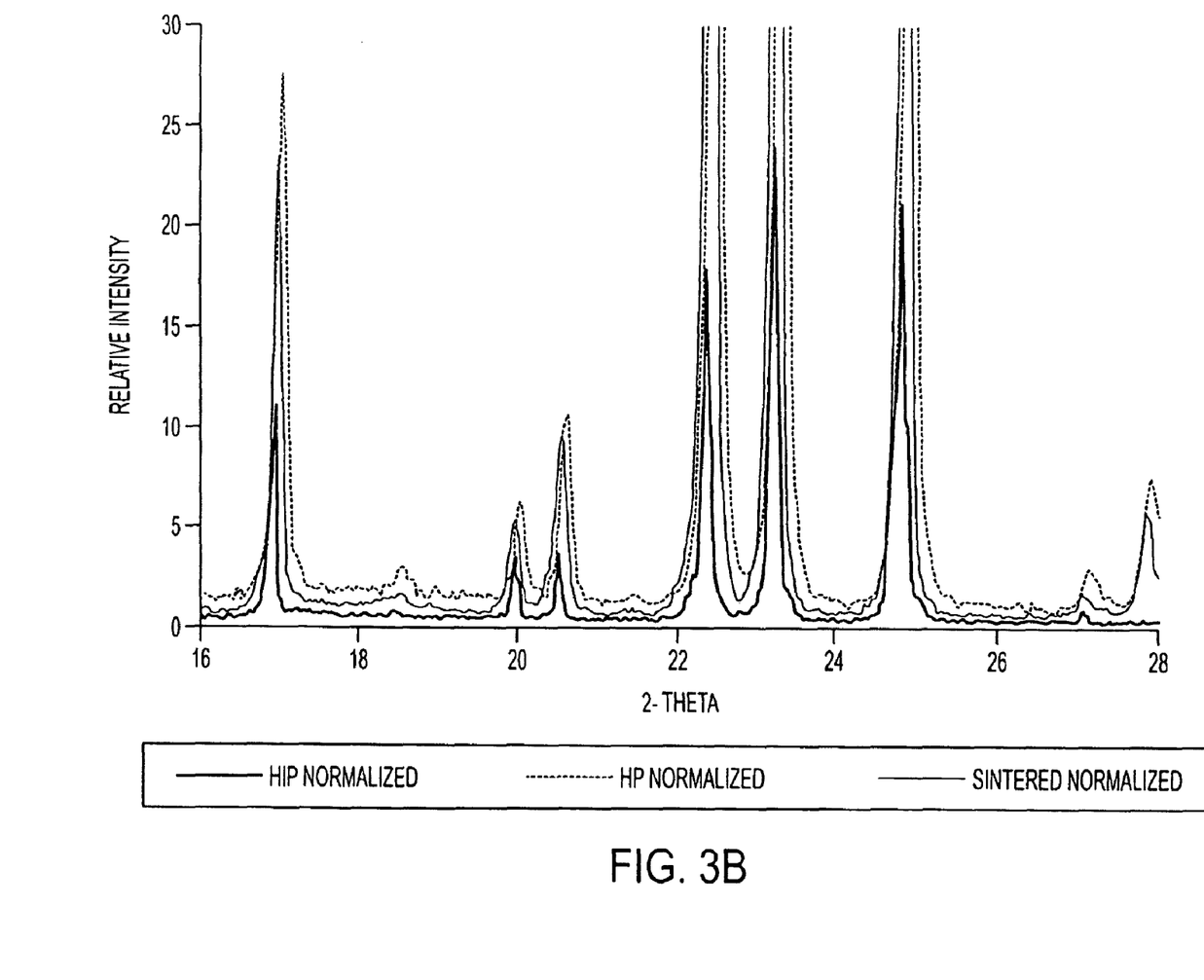
FIG. 3B is an enlarged region of the XRD analysis of three samples showing the presence of the impurity phase $Li_4P_2O_7$ in the two commercial samples and the absence of the impurity phase in a sample HIP.

Some embodiments of the present invention may result in lithium orthophosphate sputter targets with a single phase purity achieved simultaneously with high density. In order to evaluate the phase composition of available commercial lithium orthophosphate target materials, two samples were obtained. One sample was hot pressed and had a density of 95%, the other was sintered and had a density of 81%. The X-ray diffraction (XRD) analyses of these two samples, shown in FIGS. 3A and 3B, illustrate that these two samples contain substantial amounts of an impurity phase, which was identified as the lithium oxide deficient impurity compound, $Li_4P_2O_7$.

Figure 1:
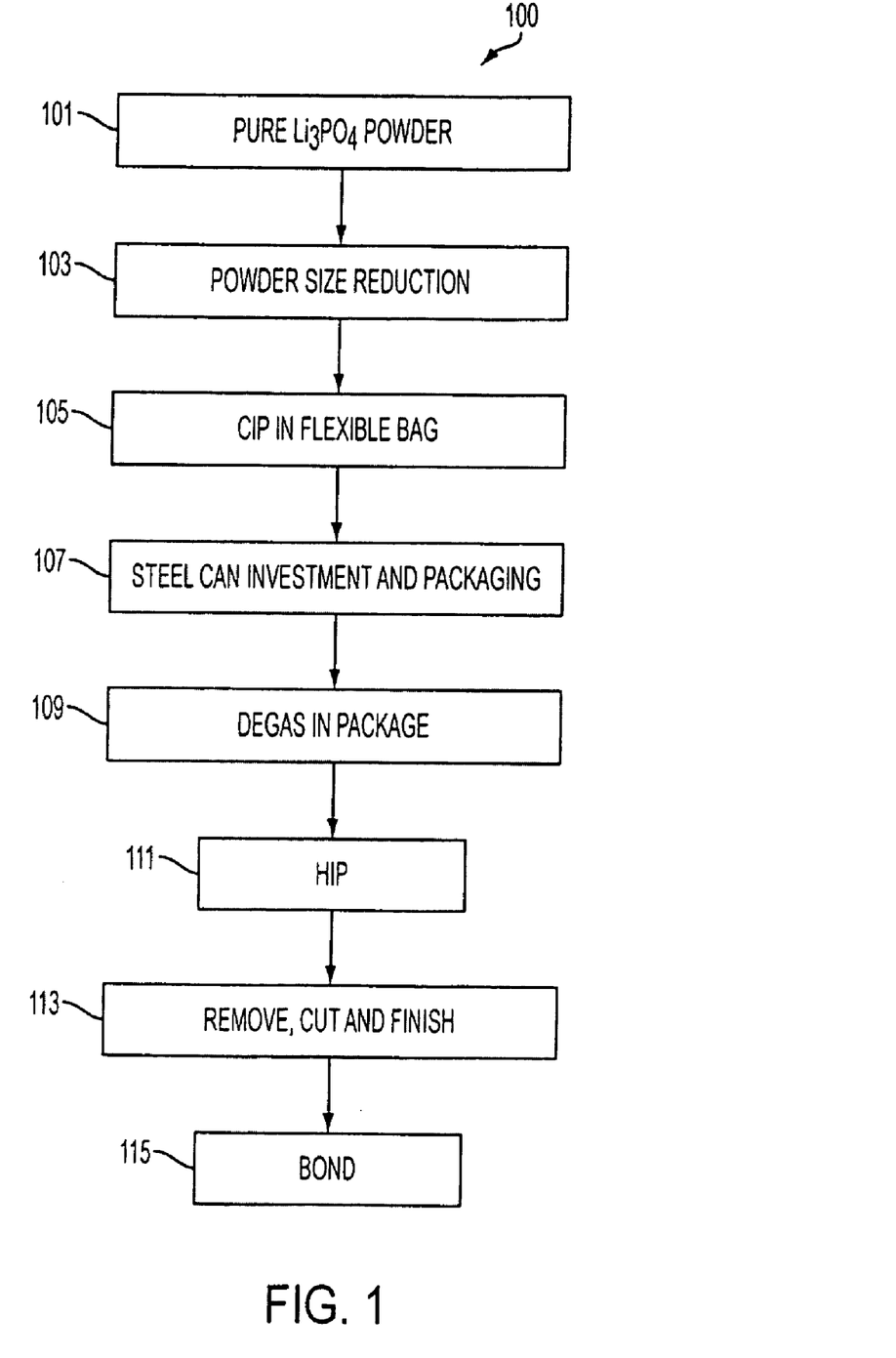
FIG. 1 illustrates a sequence of processing steps that can be used to form a sputter target of lithium orthophosphate according to an embodiment of the present invention.

FIG. 1 illustrates an embodiment of an exemplary process 100 for forming a dense, single phase lithium orthophosphate target according to some embodiments of the present invention. Process 100 can be utilized to manufacture a dense target with a single phase of lithium orthophosphate. Process 100 includes refining pure lithium orthophosphate powder 101 of the typical mesh size 80 to a refined powder 103 of mesh size 250, packaging the refined powder so as to provide the powder to a cold isostatic pressure (CIP) vessel suitable for ambient temperature processing 105, which pre-densifies the fine powder. Process 100 further comprises the steps of packaging the powder in a suitable steel container, step 107, and degassing the consolidated powder, step 109. In step 109, the steel package is evacuated and heated at a constant rate to a temperature of about 400° C. to 550° C. In step 111 the steel container is sealed and undergoes a hot isostatic pressure (HIP) process where the packaged material is heated at a constant rate to a temperature of no more than 800 to 850° C. and held at that temperature for a period of at least 2 hours at a pressure of at least 15 kpsi, and then cooled at a constant rate. The process 100 is continued with step 113 in which the can is removed by surface grinding of the steel container or can, and the ceramic body is saw cut and finished into the sputter target or sputter target tile of specific dimensions. In some embodiments, the target part is bonded in step 115 to a plate or fixture to form a cathode sputter target assembly.

Figure 4:
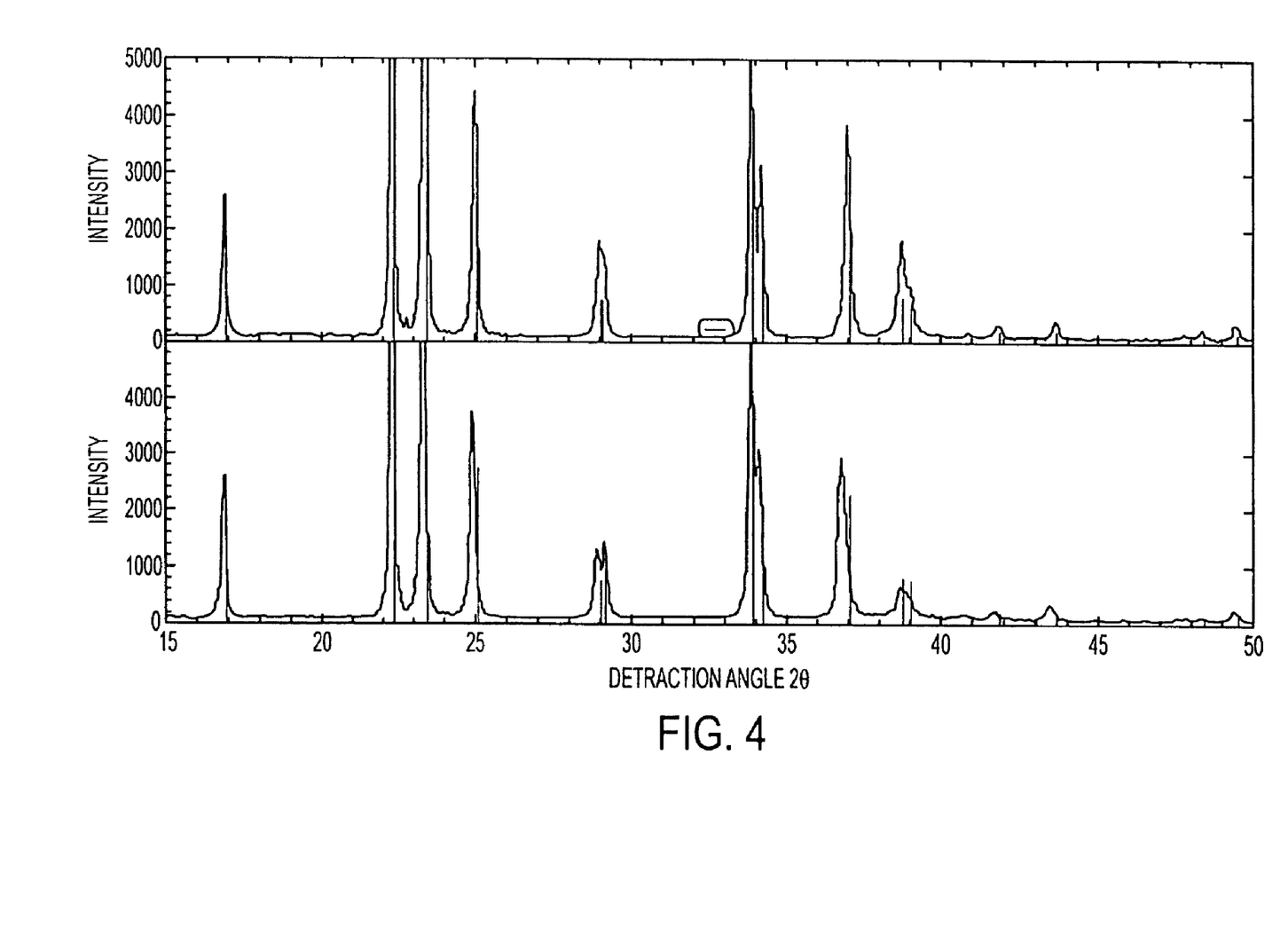
FIG. 4 is an XRD pattern of the starting powder.

According to some embodiments of process 100, a pure powder 101 of lithium orthophosphate of mesh size 80 may be prepared. A powder 103 of refined size having a mesh of 250 (average 250 mesh screen grain size is about 75 microns while average 80 mesh screen is about 180 microns) can be formed by means such as jet milling or other powder size reduction process. After de-agglomeration of the mesh 250 powder, a mean grain size of about 25 microns can be obtained. The powder can be refined to a fine grain size condition so that it will undergo high density densification in the subsequent steps 105 and 111 at temperatures lower than is used by conventional sintering, hot pressing, or HIP processes so as to avoid the formation of the impurity phase shown in FIG. 2 and FIGS. 3A and 3B (described below in detail). An X-ray diffraction pattern of the starting powder is shown in FIG. 4. The figure demonstrates that the starting powder is a single phase as the only phase present in this example is the low temperature $Li_3PO_4$. Preferably, no impurity phase is present in the starting material.

In step 105, the refined powder is packaged in a rubber mold of an appropriate size and pressed at room temperature at a pressure sufficient to densify the material to about 50-60% of the theoretical density of 2.48 g/cm$^3$ to form a green billet. In some embodiments a pressure of about 12 kpsi can be applied to form a green billet of ~50% density. The green billet can be considered a ceramic body.

According to some embodiments of the present invention, in step 107 the ceramic body formed in step 105 is packaged in a closed steel container that has a liner of, for example, molybdenum, graphite paper or graphite foil with a thickness of about $80/1000$ of an inch. The container may be equipped with a means for gas evacuation.

Process 100 may further include the step 109 of degassing the 50% dense ceramic body by evacuation of the atmosphere down to $10^{-6}$ Torr of the container formed in step 107 while heating the container at a constant rate to a temperature between 400-550° C. for a period of time to reach the appropriate vacuum level. For example, small billets can be degassed successfully at only 400° C. within a few hours but larger billets of ~10 kg may require higher temperatures of up to 550° C. to ensure degassing within 2 days.

Figure 2:
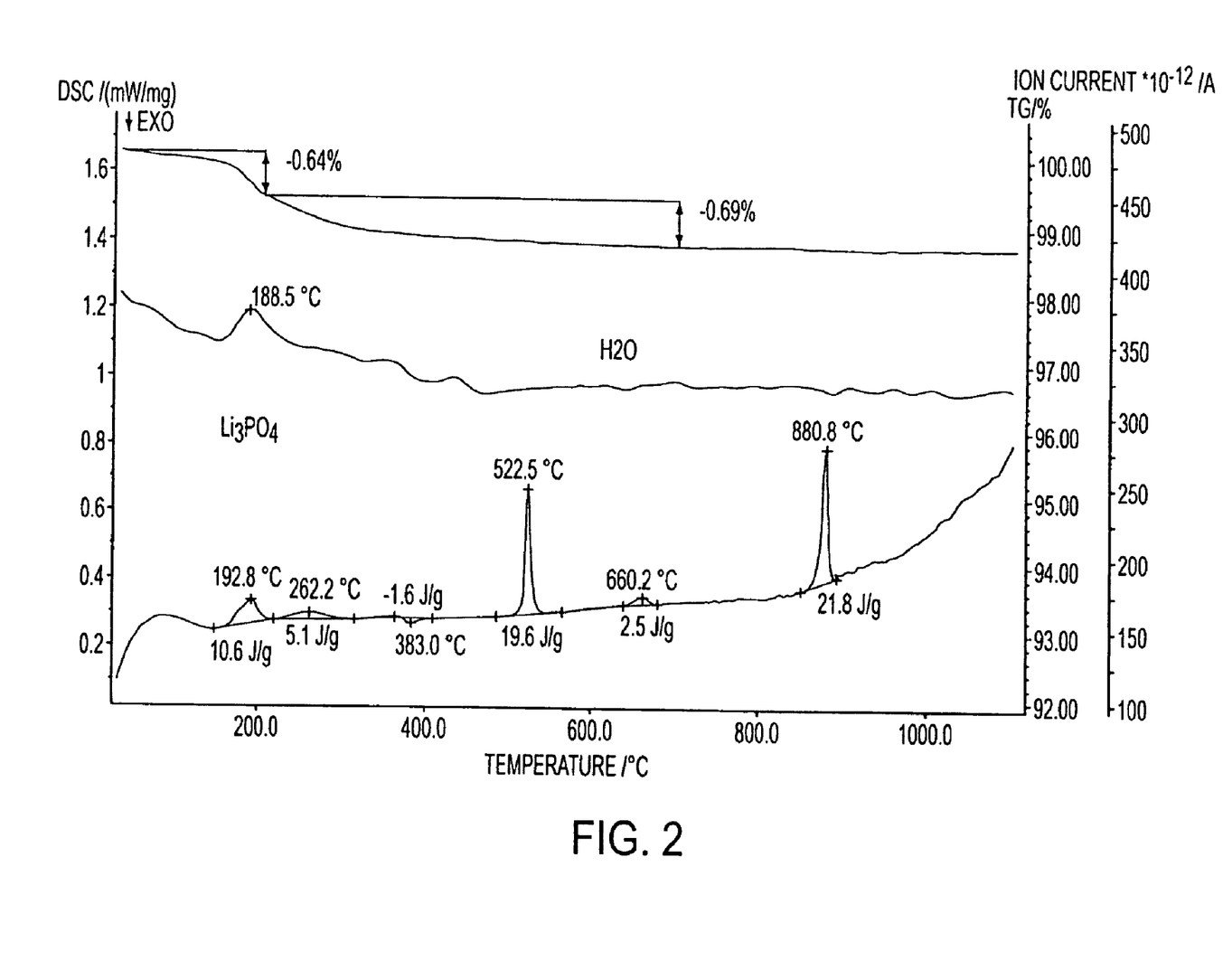
FIG. 2 shows the Differential Scanning Calorimetry (DSC) data, thermo-gravimetric (TG) data, and mass spectrometer curve for evolved water for a sample of lithium orthophosphate powder as the temperature is increased.

FIG. 2 shows the Differential Scanning Calorimetry (DSC) data, thermo-gravimetric (TG) data, and mass spectrometer curve for evolved water for a sample of lithium orthophosphate powder as the temperature is increased. The sample was heated in argon at a temperature rate of 10 K/min. Two small mass loss steps of 0.64 wt % and 0.69 wt % were detected between RT to about 200° C. and 200° C. to about 700° C., respectively. The mass spectrometer results verified that in that temperature range small amounts of $H_2O$ are evolved. In the DSC curve, exothermic peaks were detected at 193° C., 262° C., 523° C., 660° C. and 881° C. The first two exothermic peaks may be related to the release of water. The remaining peaks may represent solid-state reactions discussed further below.

The DSC data shown in FIG. 2 for a sample of lithium orthophosphate powder as the temperature is increased illustrate the thermodynamic effects of heating the material in step 109. The exothermic transition at 522.5° C. was determined to be the gamma to alpha phase transition of the parent lithium orthophosphate phase $Li_3PO_4$, which was found to have an enthalpy of 19.6 Joules per grain. In some embodiments, an alpha phase lithium orthophosphate powder can be formed during the degas process 109 into a so-called green ceramic body, comprised of an open porosity. The data in FIG. 2 were collected in argon atmosphere, in which the partial pressures of $H_2O$ and $O_2$ are much smaller than in air. The environment may affect the onset of reactions shown in FIG. 2. The heating rate may also affect the onset of reactions as well. The baking-out of the billet may occur in air, argon atmosphere or vacuum.

In step 109, the powder can be degassed and water removed. FIG. 2 suggests that substantially all of the water, $H_2O$, may be removed by about 400° C. It was discovered that a phase change took place in the pure lithium orthophosphate material at 522.5° C., which was accompanied by an enthalpy of 19.6 Joules/gram and attributed to the gamma to alpha crystal dimorphism. Because this phase transition can be associated with a change in the unit cell volume of the lithium orthophosphate crystallites, and the higher-temperature alpha phase crystals may be the more stable ones due to their exothermic enthalpy of formation, step 109 may be carried out at a temperature of 550° C. in order to increase the formation of the pure alpha phase, rather than around or below the gamma to alpha transition temperature of 522.5° C. In this way, process 100 forms the green body in a pure phase and a pure crystalline morphology that will survive the thermal cycle between processes 109 as well as the higher temperature process 111. The single phase and single crystalline morphology of the pure lithium orthophosphate achieved in the degas step 109 provides a ceramic body of uniform thermo-elastic condition, modulus, coefficient of thermal expansion (CTE), fracture toughness, etc. for the HIP process 111.

FIG. 3A illustrates the x-ray diffraction (XRD) analysis of two commercial target samples of lithium orthophosphate and a HIPed sample pressed with the method described here. It displays the comparison of sintered, and hot pressed (HP) to hot isostatically pressed (HIP) target. The sintered and the hot pressed samples both display a strong peak at 20.4 degrees, which is identified as the impurity phase $Li_4P_2O_7$, and is the main contaminating phase found in commercial target samples. In contrast, the powder sample formed in accordance with an embodiment of the present invention, which was HIP processed at 850° C., shows an x-ray diffraction intensity of almost zero at the same diffraction angle. FIG. 3B is an enlarged region of the XRD analysis of the three samples showing the presence of the impurity phase $Li_4P_2O_7$ in the two commercial samples and the absence of this impurity phase in the sample HIP processed at 850° C. according to an embodiment of the present invention.

The formation of the impurity phase $Li_4P_2O_7$ occurs at a temperature of approximately 880° C., which is shown to have an enthalpy of formation of 21.8 Joules per gram. FIGS. 3A through 3B illustrate the XRD analysis that can be used to evaluate the absence of the crystalline impurity or contaminating phase when a sputter target is formed according to some embodiments of the present invention. FIGS. 3A and 3B illustrate the presence of the impurity phase $Li_4P_2O_7$ in the commercial hot pressed and sintered sputter target materials. In contrast, the HIPed target according to embodiments of the present invention has the impurity phase at levels lower than 5%.

In order to further improve the phase purity of a lithium orthophosphate sputter target described by an embodiment of the present invention, one may add appropriate small amounts of pure $Li_2O$ powder to the powder of pure $Li_3PO_4$ prior to the powder refinement process using a mesh screen of 250. These small amounts of $Li_2O$ thermodynamically prevent the formation of the predominant impurity phase $Li_4P_2O_7$ during any of the heating steps described in the previous paragraphs. This approach is to be understood from the point that $Li_4P_2O_7$ is a lithium orthophosphate derivative, which is deficient in lithium oxide ($Li_2O$), as informally described by $Li_4P_2O_7=Li_3PO_4 \bullet LiPO_3$, wherein $LiPO_3=Li_3PO_4-Li_2O$. It has been found that appropriate small amounts of $Li_2O$ powder will thermodynamically counteract the loss of any $Li_2O$ during the sputter target fabrication process described above, thereby favoring the formation of more, pure $Li_3PO_4$ at the expense of the impurity phase $Li_4P_2O_7$.

According to some embodiments of the present invention and consistent with the conditions discovered for the degas step 109, the pre-densified ceramic body formed in step 107 is sealed in the steel container package 107. In step 111, the pre-densified ceramic body is subjected to a hot isostatic pressure (HIP) process at a heating rate of about ½° C. per minute to a temperature of below 850° C. and maintained for about 2 hours. It is thereafter cooled at a rate of ½° C. per minute. Process 111 takes about 2 days. Although the HIP process 111 can be carried out at 850° C. without the formation of an impurity phase, it was determined that stress related brittle cracking during step 113 could be reduced or eliminated by reducing the maximum temperature of step 109 to 800° C. The resulting ceramic body of pure lithium orthophosphate in step 111 may be polycrystalline, single crystalline, or glassy.

According to embodiments of process 100, the HIP can and ceramic body provided in process step 111 is removed of the steel can by surface grinding to reveal the ceramic body in step 113. The body of densified, single phase lithium orthophosphate material is then sliced, for example, by means of a diamond saw or wheel and surface ground or lapped under dry conditions to form "tiles" or plate parts suitable for sputter target fabrication, either for single tile arrangement or for multi-tile assembly, which is part of step 113.

The embodiments described above are exemplary only. One skilled in the art may recognize variations from the embodiments specifically described here, which are intended to be within the scope of this disclosure. As such, the invention is limited only by the following claims. Thus, it is intended that the present invention cover the modifications of this invention provided they come within the scope of the appended claims and their equivalents. Further, specific explanations or theories regarding the formation or performance of lithium orthophosphate target material or films formed from such target material according to embodiments of the present invention are presented for explanation only and are not to be considered limiting with respect to the scope of the present disclosure or the claims.

What is claimed is:

1. A method of forming a target, comprising:
   providing a lithium orthophosphate powder;
   refining the powder to a grain size of equal to or less than 75 microns;
   applying cold isostatic pressure processing to form a body;
   degassing said body;
   applying hot isostatic pressure processing to said body to form a dense body of single-phase lithium orthophosphate; and
   finishing said dense body to form a sputter target comprising a single phase comprising a phase purity greater than 90% and a density of greater than 90%.

2. The method of claim 1, wherein said sputter target comprises a polycrystalline $Li_3PO_4$ phase.

3. The method of claim 1, wherein said sputter target comprises a single crystal morphology of $Li_3PO_4$.

4. The method of claim 1, wherein said sputter target comprises a glassy $Li_3PO_4$ phase.

5. The method of claim 1, wherein said sputter target comprises a phase purity of greater than 95%.

6. The method of claim 1, wherein said sputter target comprises a density greater than 95%.

7. The method of claim 1, wherein said sputter target comprises a density between 95% and 99%.

8. The method of claim 1, further comprising using said target inside a vacuum sputter deposition tool.

9. The method of claim 1, further comprising mixing small amounts of lithium oxide powder with said lithium orthophosphate powder prior to said refining the powder step.

10. The method of claim 1, further comprising refining said lithium orthophosphate powder to a mesh size of 250 mesh.

11. The method of claim 1, further comprising densifying the refined powder to approximately 50% density using the cold isostatic pressure process.

12. The method of claim 1, further comprising degasifying said body at a temperature between 400° C. to 550° C.

13. The method of claim 1, further comprising applying said hot isostatic pressure processing at pressures above 10 kpsi.

14. The method of claim 13, further comprising performing said hot isostatic pressure processing at a temperature less than about 850° C. for about 2 hours.

15. A lithium orthophosphate sputter target comprising a single phase comprising a phase purity greater than 90% and a density greater than 90%.

16. The target of claim 15, wherein said phase purity is greater than 95%.

17. The target of claim 15, wherein said density is greater than 95%.

18. The target of claim 15, wherein said density is between 95% and 99%.

19. The target of claim 15, wherein said phase purity is between 95% and 99%.

20. The target of claim 15, wherein said phase purity is greater than 99%.

21. The target of claim 15, comprising a polycrystalline $Li_3PO_4$ phase.

22. The target of claim 15, comprising a single crystal morphology of $Li_3PO_4$.

23. The target of claim 15, comprising a glassy $Li_3PO_4$ phase.

* * * * *